United States Patent [19]

Engel

[11] Patent Number: 4,980,794
[45] Date of Patent: Dec. 25, 1990

[54] ELECTROMAGNETIC CONTACTOR WITH LIGHTWEIGHT WIDE RANGE CURRENT TRANSDUCER WITH SINTERED POWDERED METAL CORE

[75] Inventor: Joseph C. Engel, Monroeville Boro, Pa.

[73] Assignee: Westinghouse Electric Corp., Pittsburgh, Pa.

[21] Appl. No.: 341,272

[22] Filed: Apr. 20, 1989

Related U.S. Application Data

[63] Continuation of Ser. No. 111,007, Oct. 21, 1987, abandoned, which is a continuation-in-part of Ser. No. 16,420, Feb. 19, 1987, abandoned.

[51] Int. Cl.$^5$ .............................................. H01F 27/24
[52] U.S. Cl. ...................................... 361/187; 318/474; 324/127; 336/233; 335/298
[58] Field of Search ........................ 361/87, 93, 187; 318/474, 476; 307/131, 126; 323/358, 362; 324/127; 336/220, 233, 234; 335/298

[56] References Cited

U.S. PATENT DOCUMENTS

| | | | |
|---|---|---|---|
| 4,071,824 | 1/1978 | Kernander et al. | 324/127 |
| 4,255,494 | 3/1981 | Reen et al. | 336/233 |
| 4,456,867 | 6/1984 | Mallick, Jr. et al. | 361/33 |
| 4,597,025 | 6/1986 | Rutchik et al. | 336/229 |
| 4,841,424 | 6/1989 | Washburn et al. | 363/75 |

OTHER PUBLICATIONS

IEEE Standard Dictionary of Electrical and Electronic Terms, Third Edition (1984), pp. 220 and 956.

Nilsson, James W., Electric Circuits, Addison-Wesley Publishing Co. (1983), pp. 406–407.

Primary Examiner—A. D. Pellinen
Assistant Examiner—David Osborn
Attorney, Agent, or Firm—M. J. Moran

[57] ABSTRACT

A motor controller or contactor is disclosed which utilizes a non-saturating current transformer for sensing the amount of current flowing in the electrical conductor connected to the contactor. The current sensor is made of homogeneous sintered powdered metal having evenly distributed microscopic air gaps therein which increase the reluctance of the magnetic circuit but resist the influence of stray magnetic flux. This increased reluctance prevents magnetic saturation over a wide range of input current and allows the secondary of the transducer to produce a voltage which is proportional to the derivative of the primary current, that is the current being sensed by the transducer. The aforementioned voltage is linearly proportional to the derivative of the current over a wide range of primary current values. This voltage is integrated to produce an output signal which is directly proportional to the aforementioned primary current over the wide range of current values. By measuring only the derivative of the primary current, the current transducer can be significantly smaller than an equivalent current transformer. The homogenous magnetic core of powdered metal and interposed air gaps has a Rayleigh Constant $\lambda$ of such value $\lambda H$ is significantly less than the initial permeability less than the initial permeability $\mu_o$ of the core, thus allowing the transformer to sense current over a wide range.

58 Claims, 27 Drawing Sheets

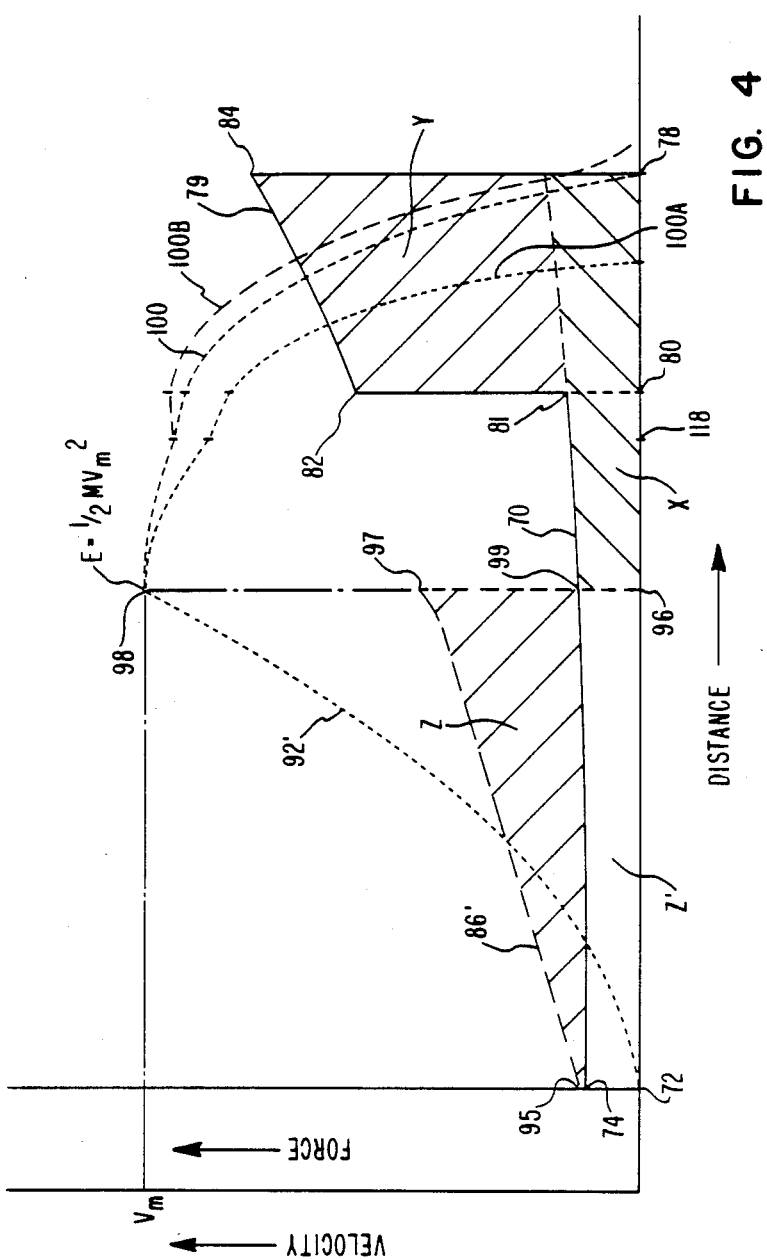

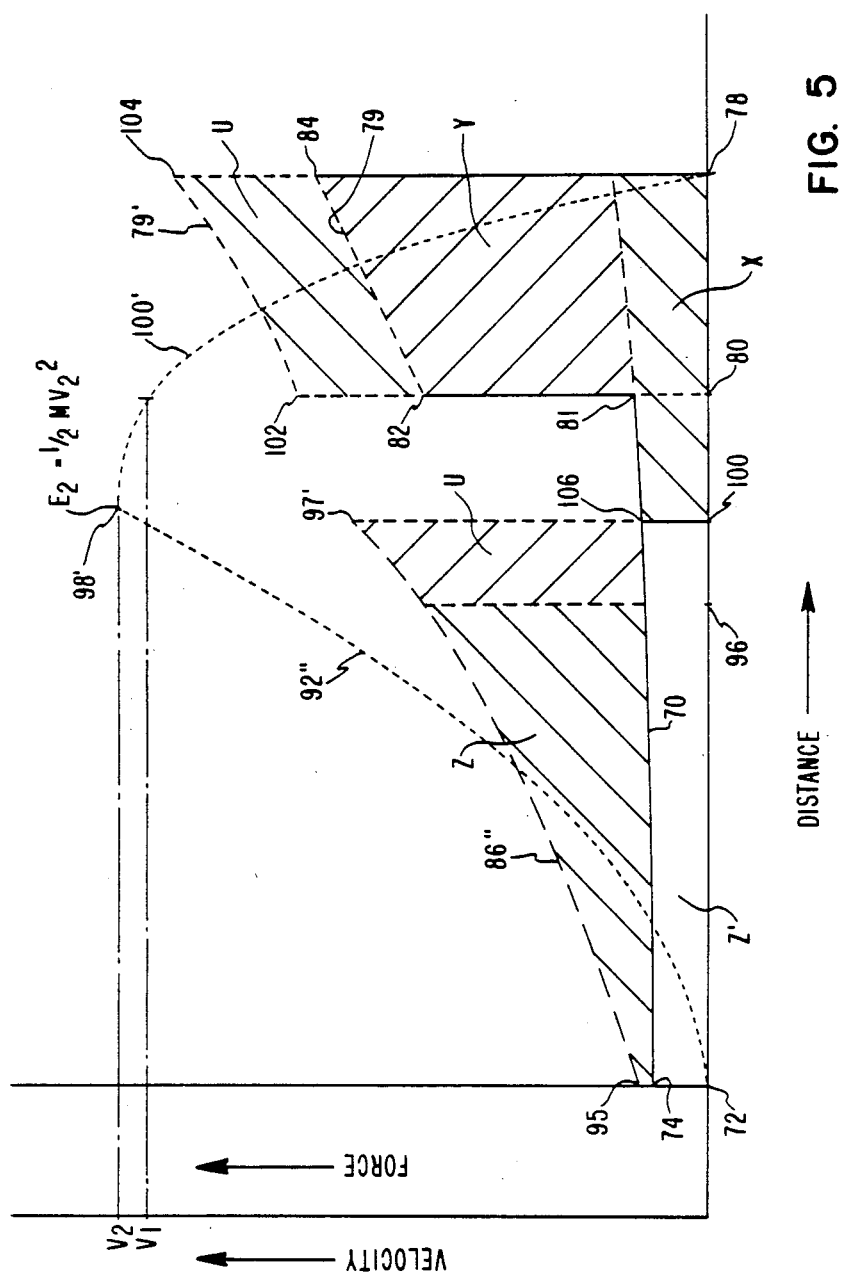

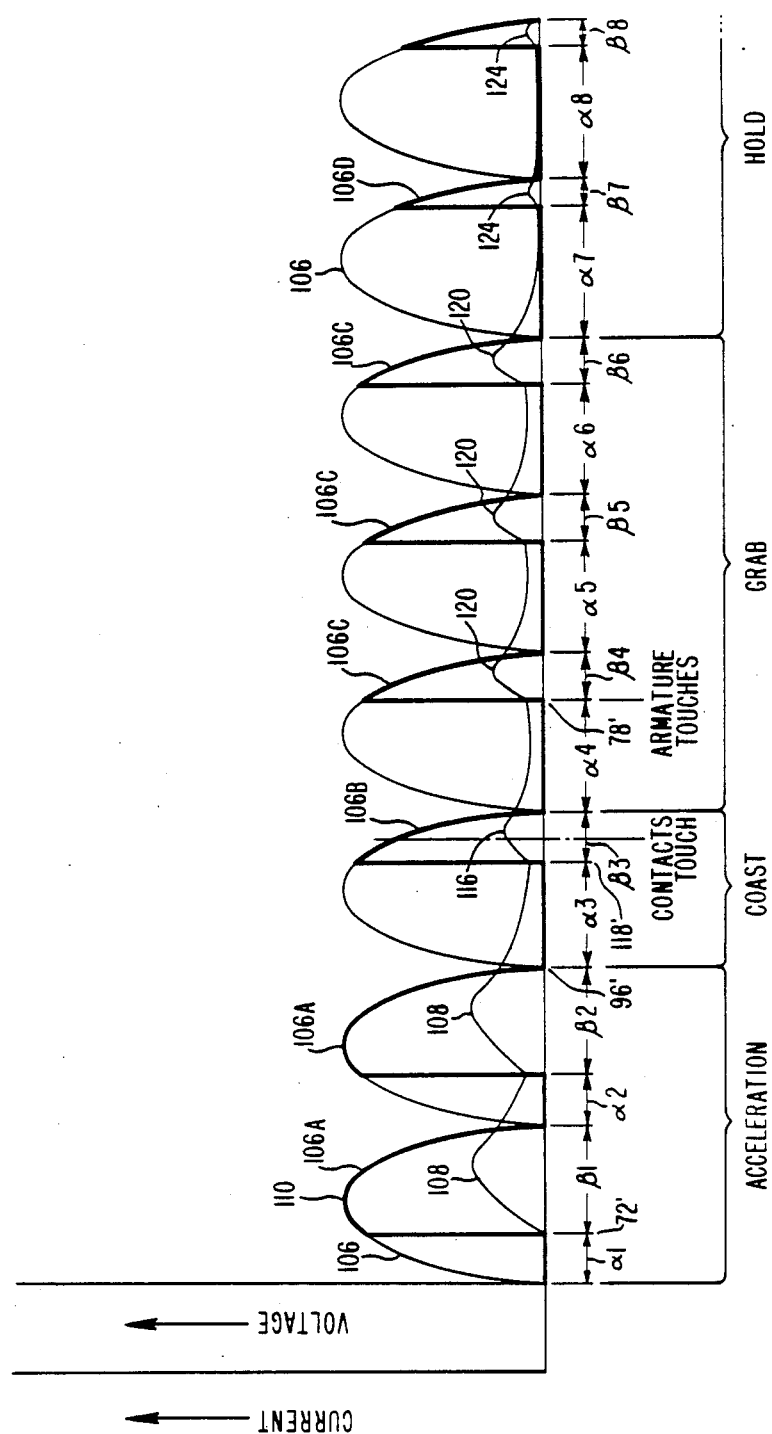

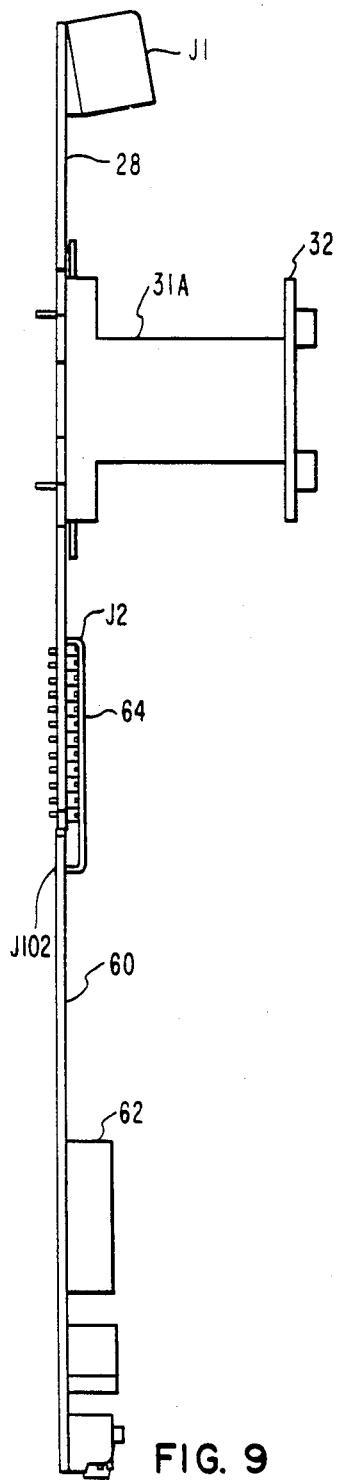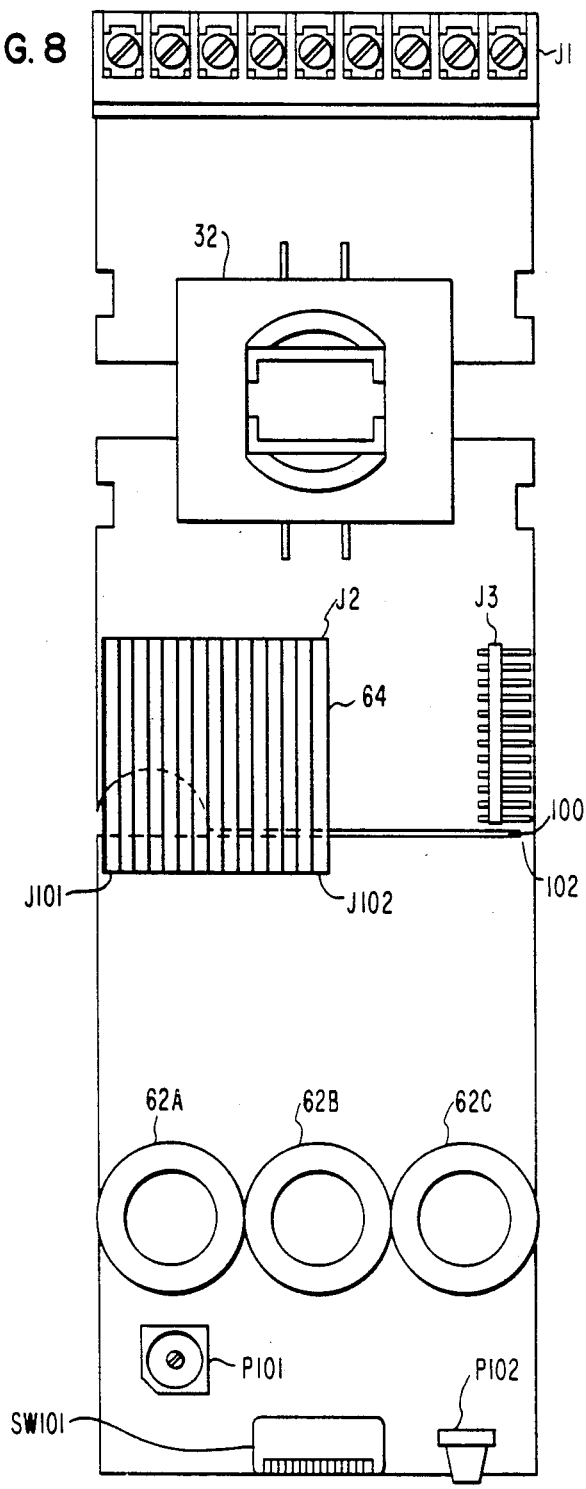
FIG. 8
FIG. 9

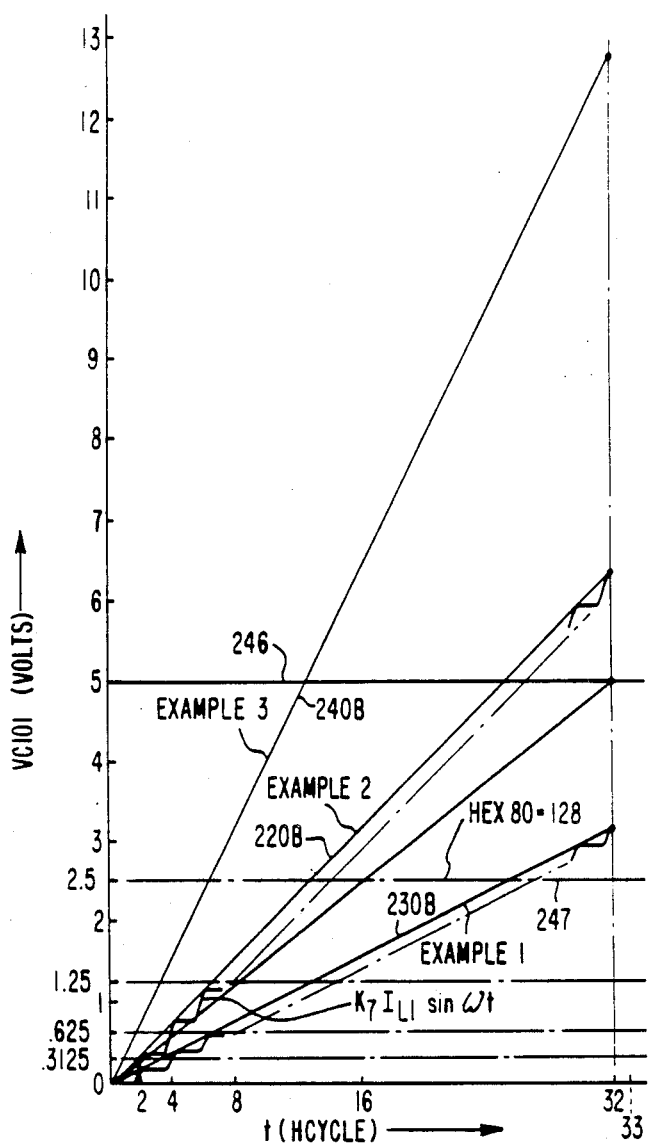
FIG. 25C
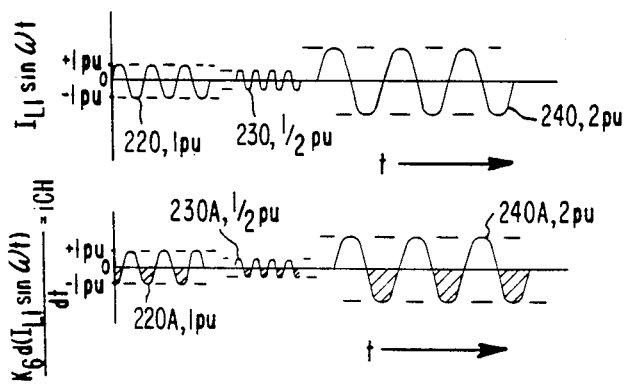
FIG. 25B
FIG. 25A

EXAMPLE 1

EXAMPLE 2

EXAMPLE 3

ELECTROMAGNETIC CONTACTOR WITH LIGHTWEIGHT WIDE RANGE CURRENT TRANSDUCER WITH SINTERED POWDERED METAL CORE

CROSS-REFERENCE TO RELATED APPLICATIONS

This application is a continuation of application Ser. No. 07/111,007 filed Oct. 21, 1987, abandoned, which is a continuation-in-part of copending U.S. patent application Ser. No. 016,420, filed Feb. 19, 1987, abandoned.

The inventions taught herein are related to concurrently filed commonly assigned copending applications as follows:

Application Ser. No. 016,425 filed concurrently herewith entitled "ELECTROMAGNETIC CONTACTOR WITH ENERGY BALANCED CLOSING SYSTEM" by J. A. Bauer, abandoned.

Application Ser. No. 016,419 filed concurrently herewith entitled "ELECTROMAGNETIC CONTACTOR WITH CONTROL CIRCUIT FOR PROVIDING ACCELERATION, COAST AND GRAB FUNCTIONS" by J. A. Bauer, now U.S. Pat. No. 4,720,763 issued January 1988.

Application Ser. No. 016,423 filed concurrently herewith entitled "ELECTROMAGNETIC CONTACTOR WITH CURRENT REGULATED ELECTROMAGNETIC COIL FOR HOLDING THE CONTACTS CLOSED" by G. F. Saletta et al., now U.S. Pat. No. 4,720,761 issued January 1988.

Application Ser. No. 016,412 filed concurrently herewith entitled "ELECTROMAGNETIC CONTACTOR WITH ALGORITHM CONTROLLED CLOSING SYSTEM" by J. A. Bauer, D. A. Mueller, R. T. Basnett and J. C. Engel, now U.S. Pat. No. 4,833,565 issue May 1989.

Application Ser. No. 016,426 filed concurrently herewith entitled "ELECTROMAGNETIC CONTACTOR WITH DISCRIMINATOR FOR DETERMINING WHEN AN INPUT CONTROL SIGNAL IS TRUE OR FALSE METHOD" by J. C. Engel, now U.S. Pat. No. 4,728,810 issued March 1988.

Application Ser. No. 016,422 filed concurrently herewith entitled "ELECTROMAGNETIC CONTACTOR WITH LIGHTWEIGHT WIDE RANGE CURRENT TRANSDUCER" by J. A. Bauer, abandoned.

Application Ser. No. 016,424 filed concurrently herewith entitled "ELECTROMAGNETIC CONTACTOR WITH UNIVERSAL CONTROL" by J. C. Engel now U.S. Pat. No. 4,748,343 issued May 1988.

Application Ser. No. 016,420 filed concurrently herewith entitled "ELECTROMAGNETIC CONTACTOR WITH WIDE RANGE OVERLOAD CURRENT RELAY BOARD UTILIZING LEFT SHIFTING AND METHOD" by G. F. Saletta et al. now U.S. Pat. No. 4,757,420 issued July 1988.

Application Ser. No. 016,417 filed concurrently herewith entitled "ELECTROMAGNETIC CONTACTOR WITH CIRCUIT BOARD SUPPORT SYSTEM" by D. W. Cole and G. E. Pruitt II, abandoned.

Application Ser. No. 016,415 filed concurrently herewith entitled "ELECTROMAGNETIC CONTACTOR. WITH REDUCED NOISE MAGNETIC ARMATURE" by R. A. Hurley and B. L. DeVault now U.S. Pat. No. 4,739,293 issued April 1988.

Application Ser. No. 725,179 entitled "ANALOG SIGNAL PROCESSING CIRCUIT," filed Apr. 19, 1985 by J. C. Engel now U.S. Pat. No. 4,626,831 issued December 1986.

Application Ser. No. 725,050 entitled "A SUPERVISORY CIRCUIT FOR A PROGRAMMED PROCESSING UNIT," filed Apr. 19, 1985 by J. C. Engle now U.S. Pat. No. 4,674,035 issued June 1987.

Application Ser. No. 868,834 entitled "MASTER METERING MODULE WITH VOLTAGE SELECTOR" by D. P. Orange J. C. Engle, G. F. Saletta, D. A. Mueller and R. T. Elms now U.S. Pat. No. 4,734,639 issued March 1988.

Application Ser. No. 868,833 entitled "MASTER METERING MODULE WITH DIGITAL SATURATION ADJUSTER AND METHOD FOR USE THEREOF" by D. P. Orange, J. C. Engel, G. F. Saletta and D. A. Mueller, abandoned.

Application Ser. No. 868,832 entitled "PROCESS FOR MANUFACTURING ELECTRICAL EQUIPMENT UTILIZING PRINTED CIRCUIT BOARDS" by S. L. Glover now U.S. Pat. No. 4,700,800, issued October 1987.

BACKGROUND OF THE INVENTION

1. Field of the Invention

The subject matter of this invention is related generally to electromagnetic contactors and more specifically to apparatus for sensing contactor current.

2. Description of the Prior Art

Electromagnetic contactors are well known in the art. A typical example may be found in U.S. Pat. No. 3,339,161 issued Aug. 29, 1967 to J. P. Conner et al. entitled "Electromagnetic Contactor" and assigned to the assignee of the present invention. Electromagnetic contactors are switch devices which are especially useful in motor starting, lighting, switching and similar applications. A motor starting contactor with an overload relay system is called a motor controller. Contactors and motor controllers sense the electrical current flowing through the closed contacts and use information related to that current for useful purposes. Often the current is sensed with classical well known current transformers where an output current which is generally proportional to the input current is provided. The traditional current transformer approach has a number of disadvantages. One disadvantages lies in the fact that traditional current transformers are only usable over a relatively small range of input current. To measure input currents outside of this range the current transformer must be replaced by a larger or smaller one. Another disadvantage lies in the fact that current transformers are typically relatively large and relatively heavy. This is very disadvantageous in situations where it is desirous to minimize the size of motor controller or contactor parts. It would be desirous therefore to provide a motor contactor or controller which utilized a current transformer or transducer which was relatively small and yet useful over a wide range of input current. Until now it has been difficult to find current transformer arrangements which meet both of the above-named criteria. For example, U.S. Pat. No. 4,454,557 issued June 12, 1984 to Hurley and entitled "Non-Linear Alternating Current Transducer" teaches a transformer device which is useful over a relatively wide range but which accomplishes the latter by deliberately providing a non-linear output. Furthermore, the transformer is utilized in various stages of saturation which is usually associated with a relatively heavy transformer with higher losses. Other current transducer arrangements which are of interest in view of the present invention are: U.S. Pat. No. 3,197,721 issued July 27, 1965 to S. E. Bogotch et al., entitled "Toroidal Apparatus with Windings Surrounding Both Core and Gap Wherein Permeable Material is Variably Positioned" and U.S. Pat. No. 4,007,414 issued Feb. 8, 1977 to Shima et al., entitled "Current Transducer Arrangement".

Many of the problems associated with the aforementioned art are solved by an invention disclosed in copending concurrently filed U.S. patent application Ser. No. 016,422 (W.E. Case 53,126) entitled "ELECTROMAGNETIC CONTACTOR WITH LIGHTWEIGHT WIDE RANGE CURRENT TRANSDUCER" by J. A. Bauer and assigned to the assignee of the present application. Even this improvement however presents a problem associated with the transducer output being influenced by the affect of stray magnetic flux. This problem has been solved in the past by utilizing a current transformer in which the secondary winding thereof is disposed about a non-magnetic insulating material in an even number of successive layers The inner layer extends from a first point on the core along substantially the entire core length to a second point closely adjacent the first point then the outer layer extends from the second point back to the first point. The winding turns in these layers are wound about the core in the same direction and both layers have a substantially equal number of turns distributed substantially uniformly along the length of the core. This has a tendency to reduce the affect of stray magnetic fields however it requires the use of a relatively tedious winding process which is time consuming and relatively expensive. Such a current transformer is taught in U.S. Pat. No. 3,449,703 issued June 10, 1969 to F. L. Steen and entitled "Current Transformer Having an Accuracy Unimpaired by Stray Flux From Its Adjacent Conductors". Iron powder toroidal cores which have relatively low permeability are disclosed in a publication entitled "Pyroferric" published by Pyroferric International Inc. of Toledo, Ill. It would be advantageous if a current transducer could be found which could be utilized with a microprocessor controlled motor contactor or controller which had the advantages associated with the previously described copending application and which was not impaired by stray magnetic flux but was nevertheless relatively simple and inexpensive to construct. U.S. Pat. No. 4,368,424 issued Jan. 11, 1983 to R. C. Miller and entitled "Mutual Inductance Current Transducer For AC Electrical Energy Meters" teaches the use of both the discrete gapped core and air core current transducers described previously with respect to the copending concurrently filed U.S. patent application Ser. No. 016,424 (W.E. Case 53,126). It would be advantageous if a new transducer could be found to replace the immediately described Miller transducer for electric energy meters and which could be accurately utilized over a very large range of input current to produce a useful output.

SUMMARY OF THE INVENTION

In accordance with the invention electrical apparatus such as motor control apparatus of the kind which performs a motor control operation as a function of motor current is taught. The motor control includes a current-to-voltage transducer which in turn includes a homogeneous magnetic core material. There is a primary winding means disposed in relationship with the magnetic core material to electrically interact therewith for providing magnetic flux in the homogeneous core material in general proportion to the amount of electrical current flowing in the primary winding. The core material comprises powdered metal with homogeneous microscopic air gaps which provide the magnetic reluctance which prevents magnetic saturation of the homogeneous magnetic core for values of electrical current I less than or equal to a predetermined amount. A relatively simple secondary winding is disposed upon the homogeneous magnetic core with little regard for spacing or distribution of the windings for providing an electrical voltage at the output terminals thereof which is generally proportional to the first derivative of the previously described input current. Furthermore, voltage sensing means is provided to receive the electrical voltage signal to provide a control operation for the controller in response to the voltage.

BRIEF DESCRIPTION OF THE DRAWINGS

For a better understanding of the invention, reference may be had to the preferred embodiments thereof, shown in the accompanying drawings in which:

FIG. 4 shows a set of curves similar to those shown in FIG. 3 but for one embodiment of the present invention;

FIG. 5 shows a set of curves similar to those shown in FIG. 3 and FIG. 4 but for another embodiment of the invention;

FIG. 6 shows still another set of curves for the apparatus of FIGS. 4 and 5 for voltage and current waveshapes;

FIG. 8 shows a plan view of a printed circuit board which includes the circuit elements of FIG. 7 as well as the contactor coil, current transducers and voltage transformers of FIG. 2;

FIG. 9 shows an elevation of the circuit board of FIG. 8;

FIG. 25A shows a plot of the derivatives of the line current shown in FIG. 25A;

FIG. 25B shows a plot of a one-half per unit, a one per unit and a two per unit sinusoidal representation of a line current for the apparatus controlled by the present invention;

FIG. 25C shows a plot of resultant analog-to-digital converter input voltage versus half-cycle sampling intervals (time) for three examples of line current magnitude of FIG. 25A;

DESCRIPTION OF THE PREFERRED EMBODIMENT

Figure 1:
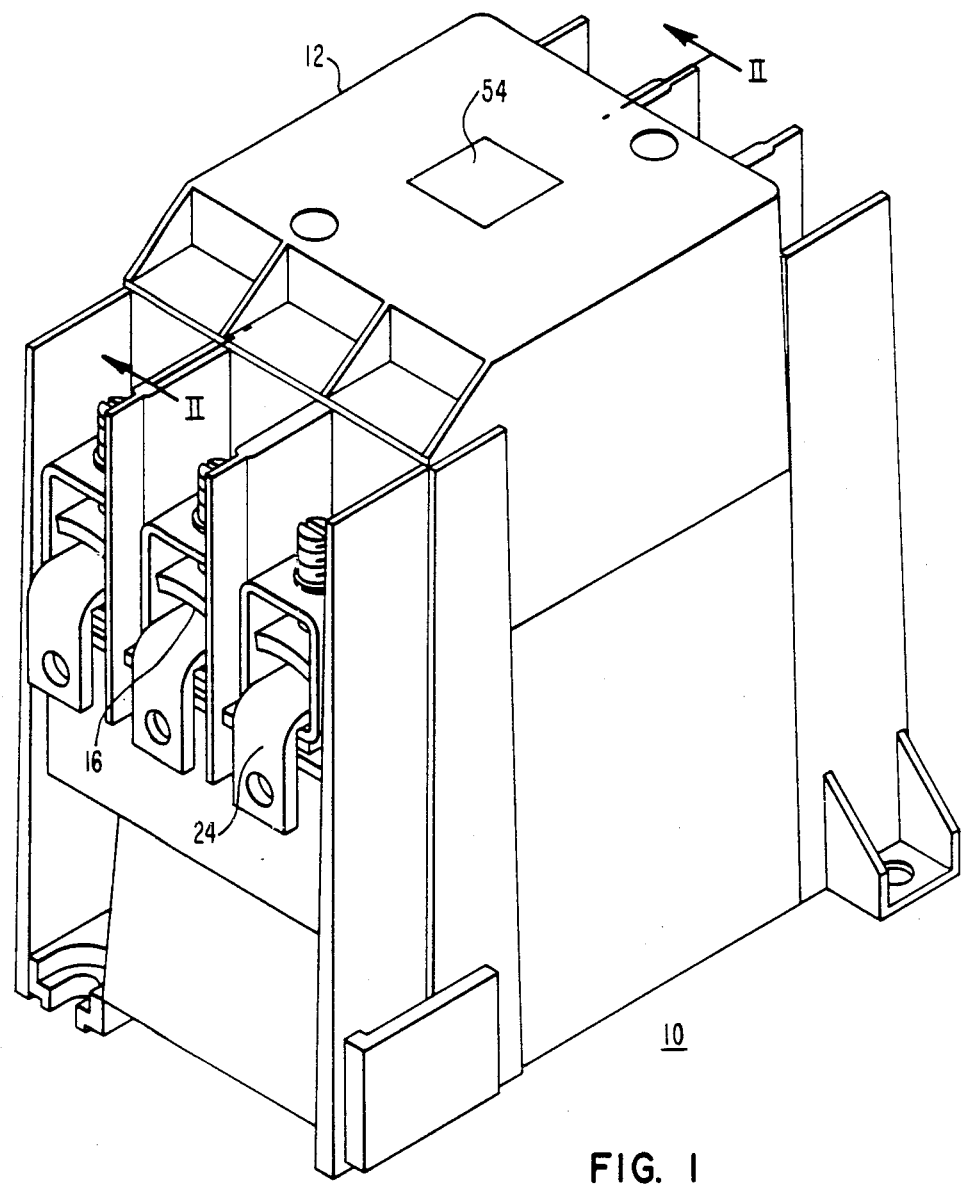
FIG. 1 shows an isometric view of an electromagnetic contactor embodying teachings of the present invention.
Figure 2:
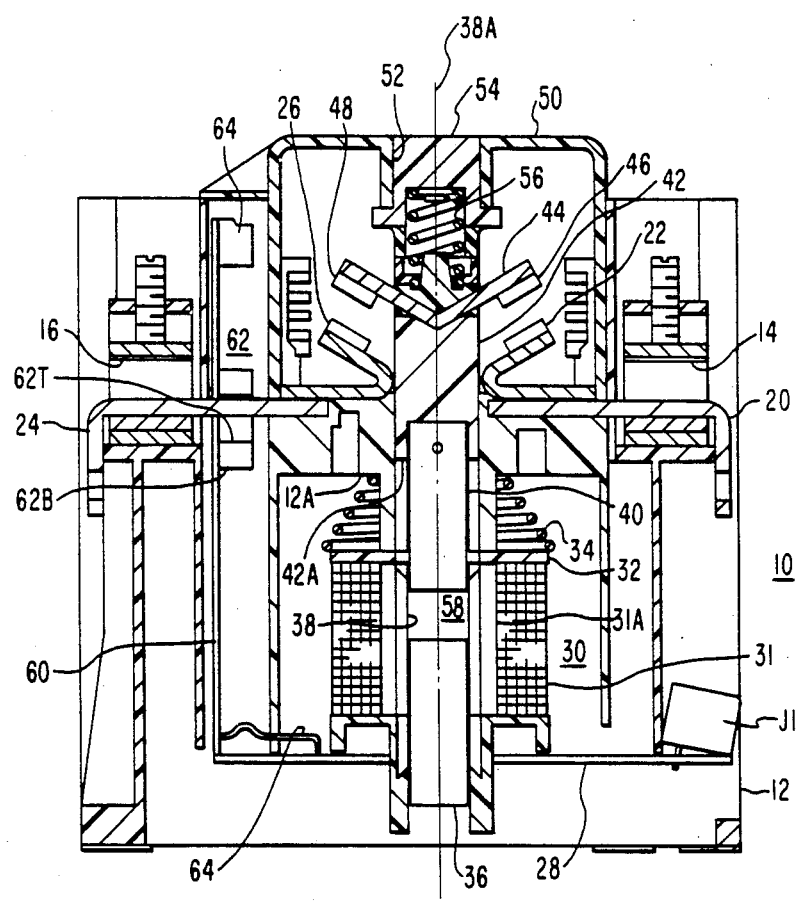
FIG. 2 shows a cutaway elevation of the contactor of FIG. 1 at section II—II thereof.

Referring to FIGS. 1 and 2, a three phase electrical contactor or controller 10 is shown. For the purpose of simplicity of illustration the construction features of only one of the three poles will be described it being understood that the other two poles are the same. Contactor 10 comprises a housing 12 made of suitable electrical insulating material such as glass/nylon composition upon which are disposed electrical load terminals 14 and 16 for interconnection with an electrical apparatus, a circuit or a system to be serviced or controlled by the contactor 10. Such a system is shown schematically in FIG. 11, for example. Terminals 14 and 16 may each form part of a set of three phase electrical terminals as mentioned previously. Terminals 14 and 16 are spaced apart and interconnected internally with conductors 20 and 24, respectively, which extend into the central region of the housing 12. There, conductors 20 and 24 are terminated by appropriate fixed contacts 22 and 26, respectively. Interconnection of contacts 22 and 26 will establish circuit continuity between terminals 14 and 16 and render the contactor 10 effective for conducting electrical current therethrough. A separately manufactured coil control board 28 (as shown hereinafter in FIGS. 8, 9 and 10) may be securely disposed within housing 12 in a manner to be described hereinafter. Disposed on the coil control board 28 is a coil or solenoid assembly 30 which may include an electrical coil or solenoid 31 disposed as part thereof. Spaced away from the coil control board 28 and forming one end of the coil assembly 30 is a spring seat 32 upon which is securely disposed one end of a kickout spring 34. The other end of the kickout spring 32 resides against portion 12A of base 12 until movement of carrier 42 in a manner to be described hereinafter causes bottom portion 42A thereof to pick up spring 34 and compress it against seat 32. This occurs in a plane outside of the plane of FIG. 2. Spring 34 encircles armature 40. It is picked up by bottom portion 42A where they intersect. The dimension of member 42 into the plane of FIG. 2 is larger than the diameter of the spring 34. A fixed magnet or slug of magnetizable material 36 is strategically disposed within a channel 38 radially aligned with the solenoid or coil 31 of the coil assembly 30. Axially displaced from the fixed magnet 36 and disposed in the same channel 38 is a magnetic armature or magnetic flux conductive member 40 which is longitudinally (axially) movable in the channel 38 relative to the fixed magnet 36. At the end of the armature 40 and spaced away from the fixed magnet 36 is the longitudinally extending electrically insulating contact carrier 42 upon which is disposed an electrically conducting contact bridge 44. On one radial arm of contact bridge 44 is disposed a contact 46, and on another radial arm of contact bridge 44 is disposed a contact 48. Of course, it is to be remembered that the contacts are in triplicate for a 3 pole contactor. Contact 46 abuts contact 22 (22–46), and contact 48 abuts contact 26 (26–48) when a circuit is internally completed between the terminal 14 and terminal 16 as the contactor 10 closes. On the other hand, when the contact 22 is spaced apart from the contact 46 and the contact 26 is spaced apart from contact 48, the internal circuit between the terminals 14 and 16 is open. The open circuit position is shown in FIG. 2. There is provided an arc box 50 which is disposed to enclose the contact bridge 44 and the terminals 22, 26, 46 and 48, to thus provide a partially enclosed volume in which electrical current flowing internally between the terminals 14 and 16 may be interrupted safely. There is provided centrally in the arc box 50 a recess 52 into which the crossbar 54 of the carrier 42 is disposed and constrained from moving transversely (radially) as shown in FIG. 2, but is free to move or slide longitudinally (axially) of the center line 38A of the aforementioned channel 38. Contact bridge 44 is maintained in carrier 42 with the help of a contact spring 56. The contact spring 56 compresses to allow continued movement of the carrier 42 towards slug 36 even after the contacts 22-46 and 26-48 have abutted or "made". Further compression of contact spring 56 greatly increases the pressure on the closed contacts 42-46 and 26-48 to increase the current-carrying capability of the internal circuit between the terminals 14 and 16 and to provide an automatic adjustment feature for allowing the contacts to attain an abutted or "made" position even after significant contact wear has occurred. The longitudinal region between the magnet 36 and the movable armature 40 comprises an air gap 58 in which magnetic flux exists when the coil 31 is electrically energized.

Externally accessible terminals on a terminal block J1 may be disposed upon the coil control board 28 for interconnection with the coil or solenoid 31, among other things, by way of printed circuit paths or other conductors on the control board 28. Another terminal block JX (shown in FIG. 32) may also be disposed on printed circuit board 28 for other useful purposes. Electrical energization of the coil or solenoid 31 by electrical power provided at the externally accessible terminals on terminal block J1 and in response to a contact closing signal available at externally accessible terminal block J1 for example, generates a magnetic flux path through fixed magnet or slug 36, the air gap 58 and the armature 40. As is well known, such a condition causes the armature 40 to longitudinally move within the channel 38 in an attempt to shorten or eliminate the air gap 58 and to eventually abut magnet or slug 36. This movement is in opposition to, or is resisted by the force of compression of the kickout spring 34 in initial stages of movement and is further resisted by the force of compression of the contact spring 56 after the contacts 22-46 and 26-48 have abutted at a later portion of the movement stroke of the armature 40.

There may also be provided within the housing 12 of the contactor 10 an overload relay printed circuit board or card 60 (also shown in FIGS. 8, 9 and 10) upon which are disposed current-to-voltage transducers or transformers 62 (only one of which 62B is shown in FIG. 2). In those embodiments of the invention in which the overload relay board 60 is utilized, the conductor 24 may extend through the toroidal opening 62T of the current-to-voltage transformer or transducer 62B so that current flowing in the conductor 24 is sensed by the current-to-voltage transformer or transducer 62B. The information thus sensed is utilized advantageously in a manner to be described hereinafter for providing useful circuit information for the contactor 10.

There may be also provided at one end of the overload relay board 60, selector switches 64, which may be accessible from a region external of the housing 12. Another embodiment of the invention is depicted on FIG. 30 and FIG. 31 the description of which and operation of which will be provided hereinafter.

Figure 3:
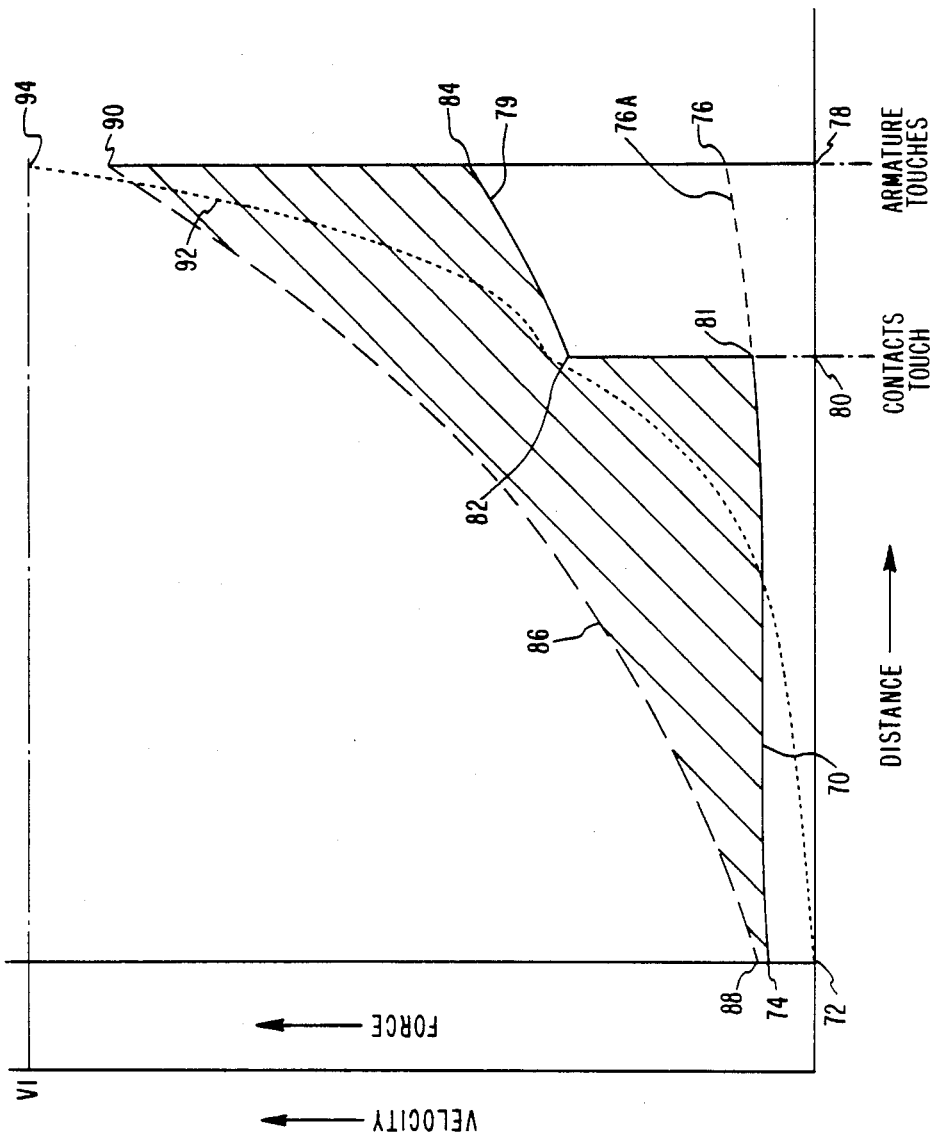
FIG. 3 shows force and armature velocity curves for a prior art contactor with electromagnetic armature accelerating coil, kickout spring and contact spring.
Figure 7A:
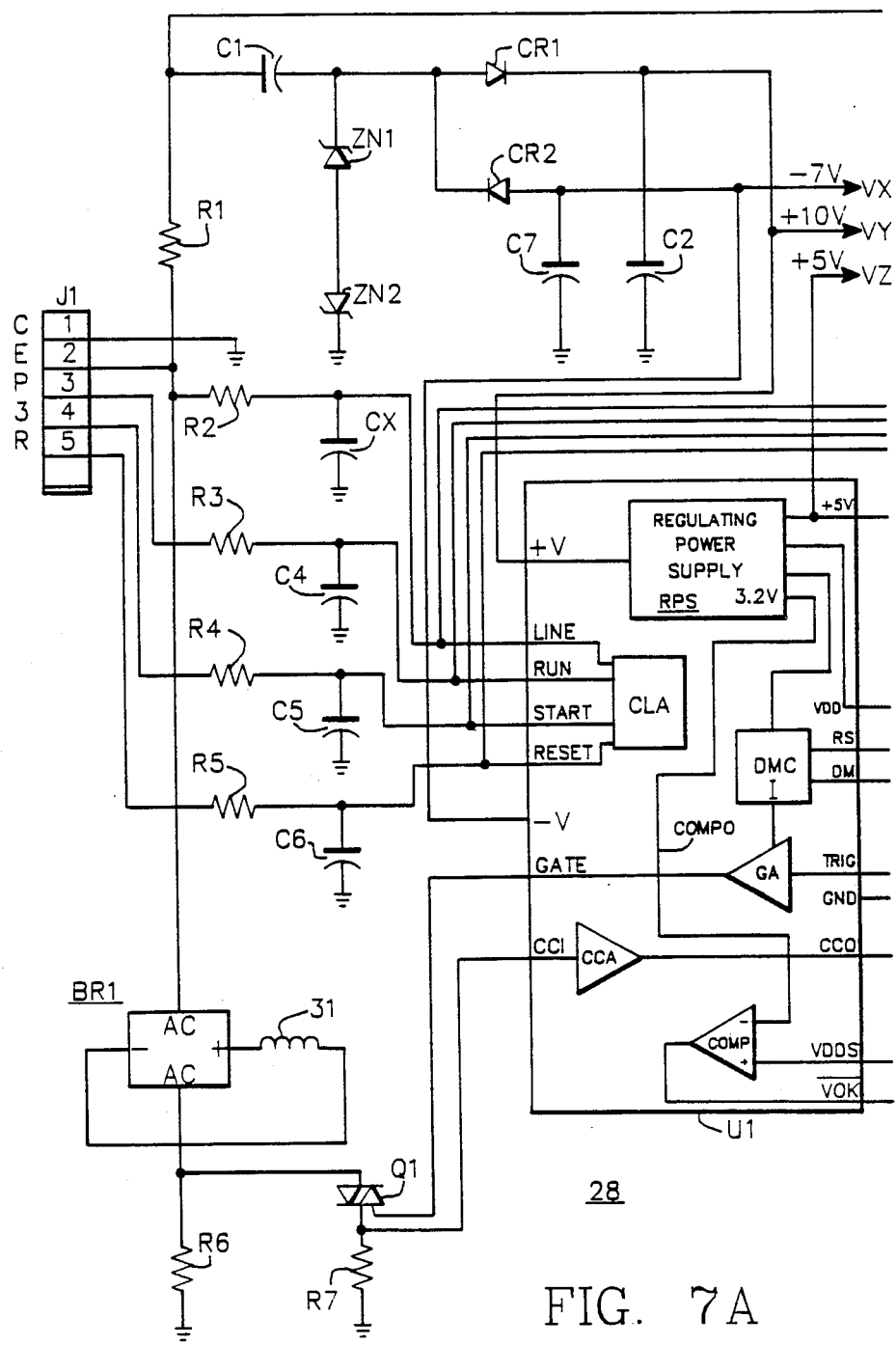
FIGS. 7A through 7D show a schematic circuit diagram partially in block diagram form for an electrical control system for the contactor of FIGS. 1 and 2.
Figure 7B:
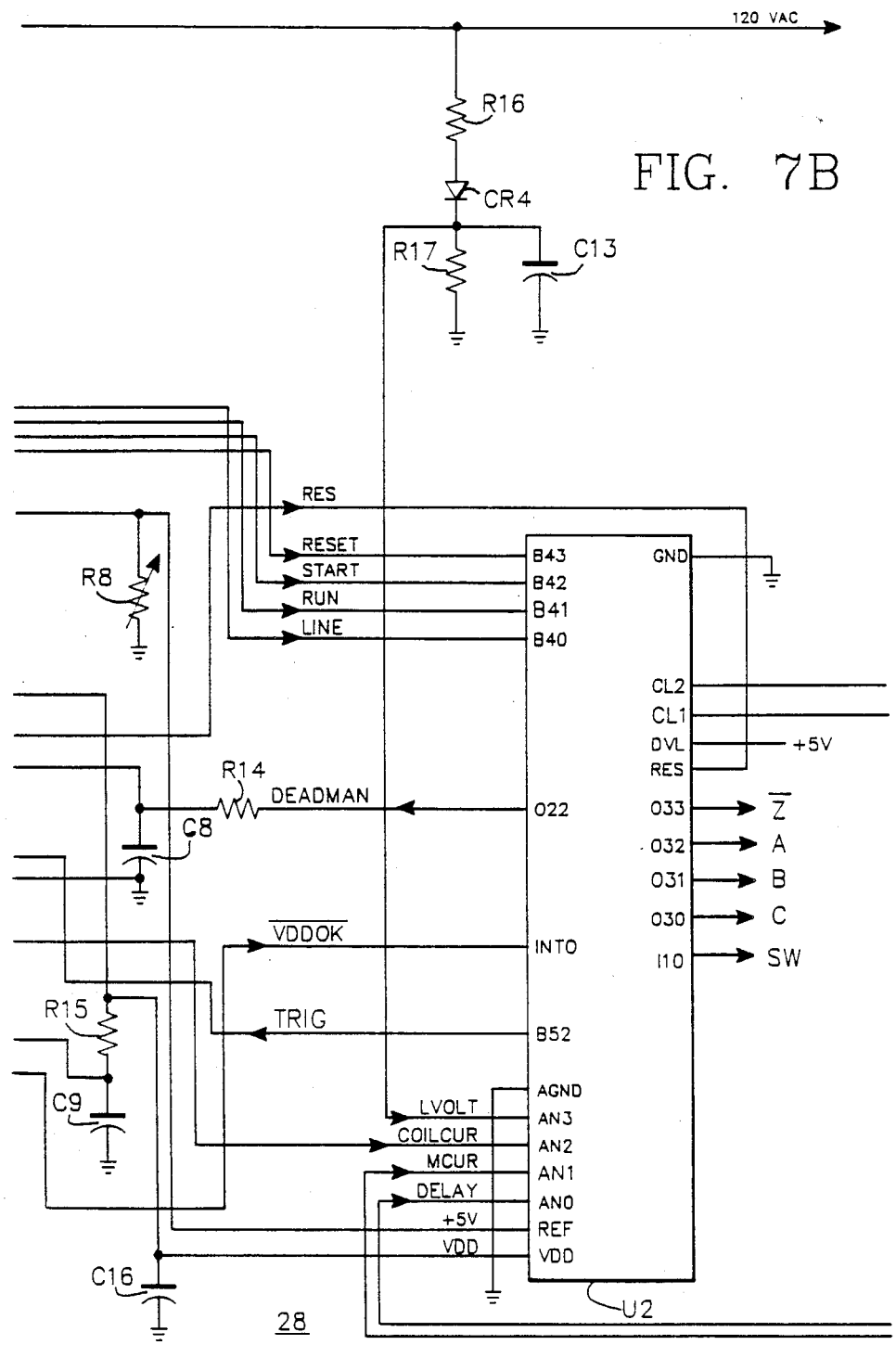
Figure 7C:
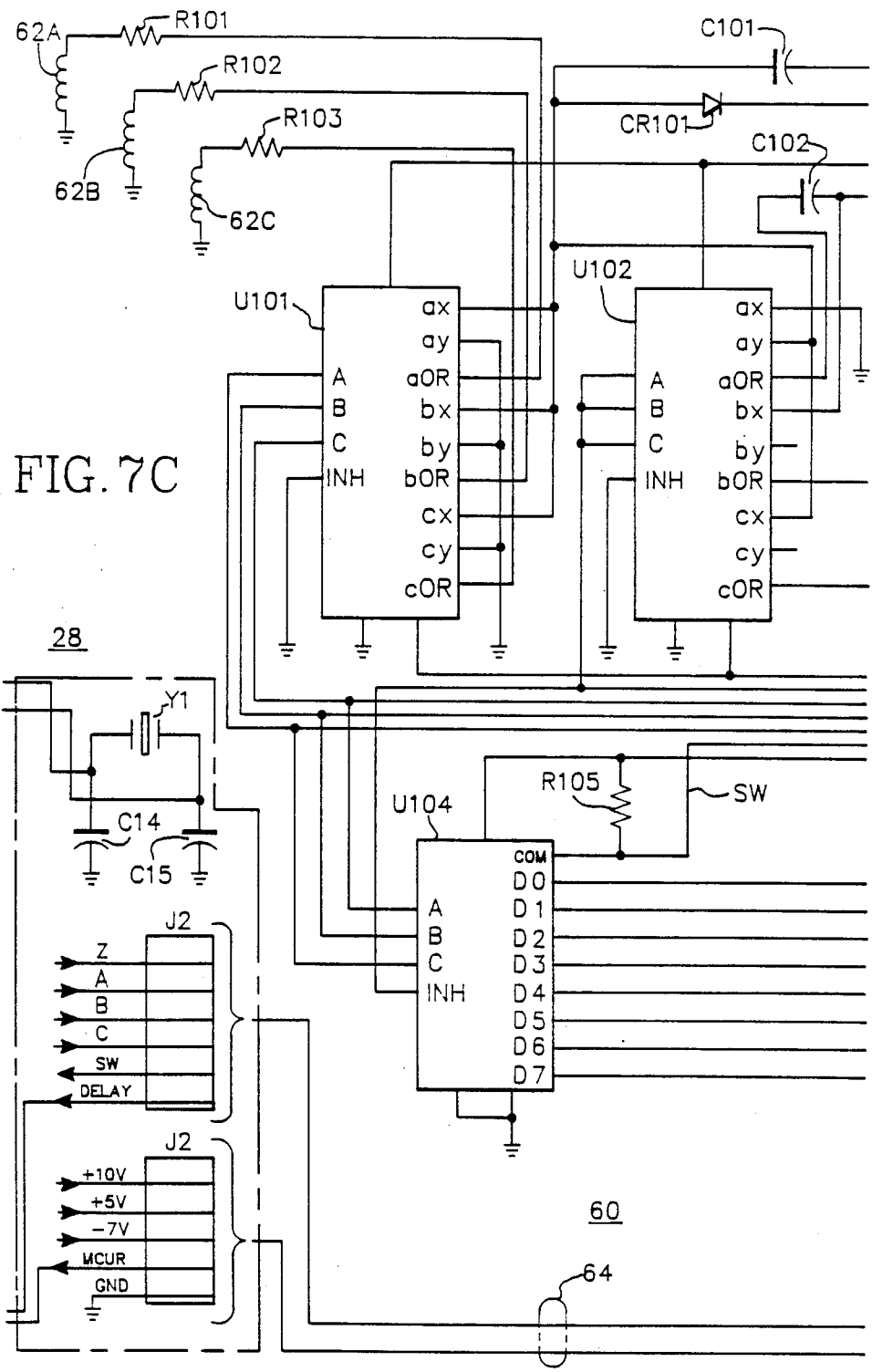
Figure 7D:
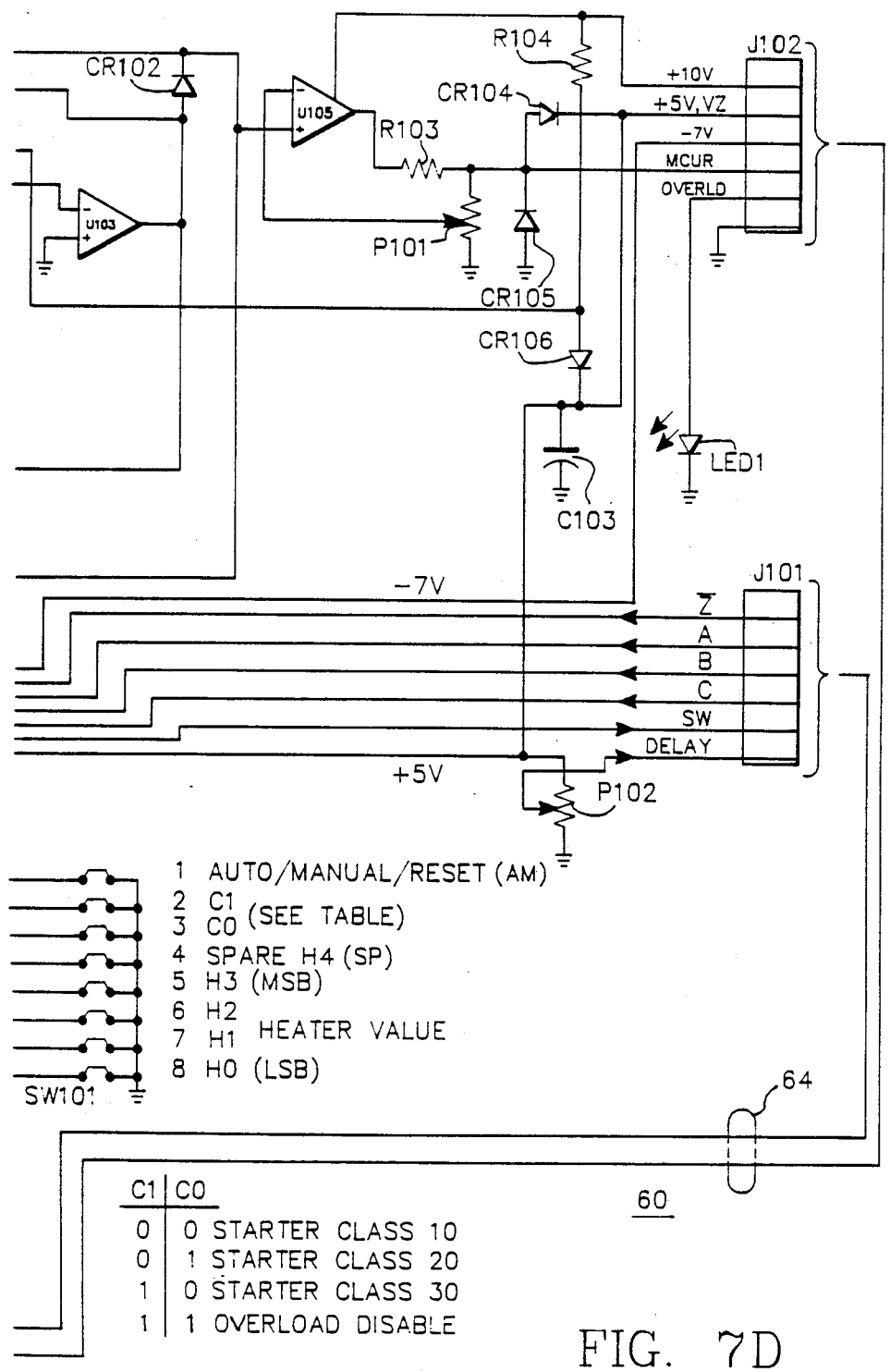

Referring now to FIG. 2 and FIG. 3, four superimposed curves are shown for the purpose of depicting the state or the art prior to the present invention. In particular, plots of force versus distance for a magnetic solenoid such as 31 in FIG. 2, a kickout spring such as 34 shown in FIG. 2, and a contact spring such as 56 shown in FIG. 2, are depicted In addition, a superimposed plot 92 of instantaneous velocity versus distance is depicted for an armature such as 40 shown in FIG. 2. Although the independent variable in each case is distance, it could just as well be time as the two variables are closely related for the curves shown in FIG. 3. It is to be understood that the reference to component parts of the contactor 10 of FIG. 2 is made for the purpose of simplifying the illustration; it is not to be presumed that the elements shown in FIG. 2, when taken together as a whole, are covered by the prior art. There is shown a first curve 70 which depicts force versus distance (time could be utilized) for a kickout spring (such as 34) as the spring is compressed starting at point 72. The spring 34 offers initial force 74. The spring 34 gradually resists compression with greater and greater force until point 78 is reached on the distance axis The area enclosed by the lines interconnecting point 72, point 74, the curve 70, point 76, point 78 and point 72 once again represents the total amount of energy that is necessary to compress a kickout spring by the movement of the armature 40 as it is accelerated to close the air gap 58 between it and the fixed magnet 36. This force resists the movement of the armature 40. At point 80 on the distance axis, the contacts 22-42 and 26-48, for example of FIG. 2, abut, and continued movement of the armature 40 causes compression of the contact spring 56 which operates to place increasing force on the now abutted contacts for reasons described previously. Curve 79 represents the total force which the moving armature 40 works against as it is accelerated to close the air gap 58. A step function increase in force between point 81 and point 82 occurs as the contacts 22-42 and 26-48 touch. This force grows increasingly larger until at point 78 the moving armature 40 experiences the maximum force applied by the combination of the kickout spring 34 and contact spring 56. That amount of additional energy which the moving armature must supply to overcome the resistance of the contact spring 56 is represented by the area enclosed by the lines which interconnect the points 81 and 82, curve 79, points 84 and 76, curve 76A and point 81 once again. Consequently, as the armature 40 is accelerated from its position of rest at 72 to its position of abutment against the magnet 36 at 78 the coil or solenoid 31 must supply at least the amount of energy represented by the lines .which connect the points 72, 74, 81, 82, 84, 78 and 72 once again. The positive slope of curve 70 is purposely kept as small as possible consistent with allowing the armature 40 to be driven in the reverse direction when the coil energy is removed so that the contactor may reopen. The initial force required to be overcome by the armature 40 in its first instant of movement is the threshold value of force represented by the difference between the points 72 and 74. Consequently, the armature must supply at least that much force at that instant of time. For purposes of simplicity of illustration, therefore, in an illustrative sense, it will be presumed that the electromagnetic coil 31 provides the force represented at point 88 in FIG. 3 for the armature 40 at 72. It is also necessary that the amount of force provided by the coil or solenoid 31 at the instant that the contacts 22-42 and 26-48 touch and the contact spring 56 is engaged at 80 be greater than the amount of force represented by the distance between the points 80 and 82 in FIG. 3, otherwise, the accelerating armature 40 will stall in midstroke, thus providing a very weak abutment of contacts 22–46 and 26–48. This is an undesirable situation as the tendency for the contacts to weld shunt is greatly increased under this condition. Consequently, the force supplied by the coil 31 in accelerating the armature 40 must be greater at point 80 than the force represented at point 82. A magnetic pull curve for solenoids and their associated movable armatures follows relatively predictable configurations which are a function of many things including the weight of the armature, the strength of the magnetic field, the size of the air gap, etc. Such a curve is shown at 86 in FIG. 3. With the relative shape of the curve 86 and the previous conditions of constraint associated with the value of the force required of the coil 31 at points 72 and 80 on the distance axis of FIG. 3, the entire profile for the magnet pull curve for the armature 40 and coil 31 of FIG. 2 is fixed. It ends with a force value 90. It is to be understood that it is a characteristic of magnetic pull curves that the magnetic force increases appreciably as the air gap 58 narrows as the moving armature 40 approaches the stationary magnet 36. Consequently, at point 78, the force 90 exists. It is at this point that the armature 40 first abuts or touches the fixed magnet 36. This unfortunately creates two undesirable situations. First, it can be easily seen that the total energy supplied to the magnetic system by way of the coil 31, as represented by the lines which interconnect the points 72, 88, curve 86, points 90, 78 and point 72 once again, is significantly greater than the amount of energy needed to overcome the various spring resistances. The difference in energy is represented by the area enclosed by the lines which connect the points 74, 88, curve 86, points 90, 84, 82, 81 and 74 once again. This energy is wasted or unnecessary energy, and it would be very desirable not to have to produce this energy. The second undesirable characteristic or situation is the fact that the armature 80 is accelerating at its maximum and producing its most force of kinetic energy at the instant immediately before it makes abutting contact with the permanent magnet 36. A velocity curve 92 which starts at point 72 and ends at point 94 as shown in FIG. 3, represents the velocity of the armature 40 as it accelerates along its axial motion path. Note the change in shape at 80 as the kickout spring 34 is engaged. At the time immediately before the armature 40 touches the permanent magnet 36, the velocity V1 is maximum. This has the very undesirable characteristic of transferring high kinetic energy due to high velocity at the instant of impact or abutment between the armature 40 and the permanent magnet 36. This energy must be instantaneously dissipated or absorbed by other elements of the system. Typically, the reduction of the armature velocity to zero instantaneously at 78 requires the energy to be instantaneously reduced. This kinetic energy is converted to the sound of abutment, to heat, to "bounce", to vibration, and mechanical wear, among other things If the armature 40 bounces, since it is loosely interconnected with the contacts 46–48 on the contact bridge 44 by way of the contact spring 56, there is a high likelihood that the mechanical system represented thereby will oscillate or vibrate in such a manner that the contact arrangements 22–42 and 26–48 will rapidly and repeatedly make and break This is a very undesirable characteristic in an electrical circuit. It would therefore be desirable to utilize the contactor 10 of FIG. 2 in such a manner that the energy which is supplied to the coil 31 is carefully monitored and chosen so that only the exact amount of energy (or an energy value close to that amount) which is necessary to overcome the resistance of the kickout spring 34 and the contact spring 56 is provided Furthermore, it would be desirable if the velocity of the moving armature 40 is significantly reduced as the armature abuts against the permanent magnet 36 so that the likelihood of "bounce" is correspondingly reduced. The solution to the aforementioned problems is accomplished by the present invention as shown graphically in FIGS. 4, 5 and 6, for example.

Referring now to FIG. 2, FIG. 3 and FIG. 4, a series of curves similar to those shown in FIG. 3 is depicted in FIG. 4 for the present invention. In this case, the spring force curves 70 and 79 for the kickout spring 34 and contact spring 56 respectively are the same as those shown in FIG. 3. However, the energy represented by the contact spring and kickout spring are designated X and Y respectively. In this embodiment of the invention, the magnet pull curve 86' representing the force applied by the coil 31 starts at point or force level 95 in order to overcome the kickout spring threshold force as described previously and continues on to point or force level 97 which occurs at distance 96. It will be noted that the electrical energy supplied to the armature 40 by the coil 31 ceases at distance 96 corresponding to force level 97. This occurs before the armature 40 has completed its movement to the position of abutment with fixed magnet 36. It will be noted at this time that the maximum velocity $V_m$ attained by the armature 40 is indicated at point 98 on the 20 velocity curve 92'. This is the maximum velocity that the armature will attain during its movement to the position of abutment with the magnet 36. Said in another way, this means that once the electrical energy has been removed from the coil 31, the armature will cease accelerating and begin to decelerate. The deceleration curve is shown at 100 in FIG. 4 and it ranges from point 98 to point 78 with a slope change where the kickout spring is engaged. This is accomplished by prematurely interrupting the flow of electrical energy to the coil 31 at the time distance 96 is achieved. Prior to the armature 40 completing its movement to the position of abutment with fixed magnet 36, only that amount of energy necessary to overcome the spring forces need be applied, thus providing for an energy-efficient system. At the time the electrical energy is removed from the solenoid 31, the energy necessary to complete the movement of the armature to its resting position of abutment with magnet 26, is represented by the area enclosed by the lines interconnecting the points 96, 99, curve 70, points 81, 82, curve 79, points 84, 78 and 96 once again. This energy is supplied during that portion of time that electrical energy is being supplied to the armature coil 31 which is represented by the area Z (not necessarily to scale) enclosed by the lines interconnecting the points 74, 95, curve 86', points 97, 99 and point 74 once again. The latter-mentioned energy balance is chosen in some convenient way which may include empirical analysis in which the energy levels are determined experimentally. The energy represented by area Z' is utilized to compress the kickout spring 34 during initial movement of the armature and is not available for utilization later in the travel stroke. As will be described hereinafter, a microprocessor may be utilized to determine the amount of energy to be supplied. The continued motion of the armature 40 during the deceleration phase depicted by curve 100 is a function of the kinetic energy level E attained by the armature 40 at point 96 as the electrical energy is removed from coil 31. This energy E is equal to one-half the mass (M) of the armature times the velocity ($V_m$) it achieves at point 98 squared. In a perfectly energy-balanced system, the decelerating armature 40 strikes the permanent magnet 36 with zero velocity at 78, thus eliminating bounce and the need to absorb excessive energy in the form of noise, wear, heat, etc. It is to be understood, of course, that the attainment of the ideal as shown in FIG. 4 is difficult and is, in fact, not necessary for a highly efficient system to be nevertheless produced. Consequently, FIG. 4 should be viewed as depicting an ideal system which is provided to illustrate the teachings of the present invention. It may become very difficult to have the armature 40 impact the permanent magnet 36 with exactly zero velocity at 78. A small residual velocity is tolerable, especially when compared with the velocity 94 which is attained in the prior system as shown in FIG. 3.

Referring now to FIG. 2, FIG. 4 and FIG. 5, a collection of curves similar to that shown in FIG. 4, is depicted for a system in which the contact spring 56 is stiffer and thus offers more force against which the moving armature 40 must work. In addition to the foregoing, other illustrative features are depicted; for example, the electrical power is applied to the coil for a longer period of time, thus allowing the velocity of the moving armature 40 to attain a higher value. The higher value of velocity is necessary because increased kinetic energy is necessary to overcome the increased spring force of the contact spring 56. With regard to the comparison of FIGS. 4 and 5, like reference symbols represent like points on the curves of the two figures. In the embodiment of the invention of FIG. 5, the total energy necessary to compress the kickout and contact springs 34 and 56, respectively, is increased by an amount U represented by the area enclosed by the c curves or lines connecting the points 82, 102, curve 79′, points 104, 84, curve 79 and point 82 once again. The remaining area, i.e., the area enclosed by the lines interconnecting the points 72, 74, curve 70, points 81, 82, curve 79, points 84, 78, and 72 once again, is the same as that shown in FIG. 4. In order to provide the increased energy U, a different magnet pull curve 86″ is generated. This magnetic pull curve has a slightly higher average slope and continues for a time period represented by the distance difference between point 96 and point 100 thus generating an incremental increase in energy U. The new magnetic pull curve 86″ starts at point 95, which may the same as that shown in FIG. 4, and ends at point 97′ at time represented by distance 100. This in turn generates a steeper and longer velocity curve 92″ for the moving armature 40. The peak velocity $V_2$ is attained at point 98′ on velocity curve 92″. At this time, the kinetic energy ($E_2$) of the armature 40 is equal to one-half $MV_2$ squared. The instantaneous velocity then decreases, following curve 100′ with a definite breakpoint at velocity $V_1$. This breakpoint represents the armature initially abutting against the contact spring 56. A portion of the increased velocity $V_2$ and thus increased energy $E_2$ is quickly absorbed by the previously described increase in energy provided by the stiffened or more resistive contact spring such that the curve 100′ theoretically reaches zero at the point 78 which corresponds to the moving armature 40 abutting the fixed magnet 36.

Referring now to FIGS. 2, 4 and 6, voltage and current curves for the coil 31 and their relationship to force curves of FIG. 4 are shown and described. In a preferred embodiment of the invention, the coil current and voltage are controlled in a manner described with respect to the embodiment of FIG. 7 in a four-stage operation: (1) the ACCELERATION stage, for accelerating the armature 40, (2) the COAST stage, for adjusting the speed of the armature later in the armature movement operation prior to abutment of the armature 40 with the fixed magnetic 36, (3) the GRAB stage, for sealing of the armature 40 against the fixed magnet 36 near or immediately after abutment to dampen oscillation or bounce, if any, and (4) the HOLD stage, for armature hold-in. Reference may be had to Table 1 to help understand the foregoing and that which follows. Information from cable 1 is disposed as a menu in memory in a microprocessor as will be described hereinafter. Electrical energy is supplied to the coil or solenoid 31 at a time 72′ which is related to point 72 on the distance axis of FIG. 4 and ending at a time 96′ which is related to point 96 on the distance axis of FIG. 4 for the ACCELERATION stage. The energy represented by areas Z and Z′ in FIG. 4 is provided by judicious choice of the electrical voltage across the terminals of coil 31 and the electrical current flowing therethrough.

TABLE 1

| | ACCELERATION | | COAST | | GRAB | | HOLD |
|---|---|---|---|---|---|---|---|
| Control Voltage 106 (VOLTS) | Number of Pulses of Coil Current 108 | Percent Conduction of TRIAC Q1 FOR $\beta_1, \beta_2$ (%) | Number of Pulses of Coil Current 108 | Percent Conduction of TRIAC Q1 FOR $\beta_3$ (%) | Number of Pulses of Coil Current 108 | Percent Conduction of TRIAC Q1 FOR $\beta_4, \beta_5, \beta_6$ (%) | Percent Conduction of TRIAC Q1 FOR $\beta_7, \beta_8 \ldots$ etc (%) |
| Below 78 VAC | None | — | None | — | None | — | — |
| 78.0–96.0 | 2 | 58 | 1 | 53 | 3 | 89 | $\beta_7$ Equal 22% Initial. Then regulate to 0.28 A Peak of coil current 108. |
| 96.0–114.0 | ↓ | 53 | ↓ | 39 | ↓ | 70 | ↓ |
| 114.0–132.0 | 2 | 43 | 1 | 37 | 3 | 55 | $\beta_7$ Equal 22% Initial. Then regulate to 0.28 A Peak of coil current 108. |

TABLE 1-continued

| | CLOSING PROFILE | | | | | | |
|---|---|---|---|---|---|---|---|
| | ACCELERATION | | COAST | | GRAB | | HOLD |
| Control Voltage 106 (VOLTS) | Number of Pulses of Coil Current 108 | Percent Conduction of TRIAC Q1 FOR $\beta_1, \beta_2$ (%) | Number of Pulses of Coil Current 108 | Percent Conduction of TRIAC Q1 FOR $\beta_3$ (%) | Number of Pulses of Coil Current 108 | Percent Conduction of TRIAC Q1 FOR $\beta_4, \beta_5, \beta_6$ (%) | Percent Conduction of TRIAC Q1 FOR $\beta_7, \beta_8 \ldots$ etc (%) |
| Above 132 VAC | None | — | None | — | None | — | — |

The apparatus and method for controlling that voltage and current will be described more fully hereinafter with respect to FIG. 7. At this time, for purpose of simplicity of illustration, the appropriate wave shapes will be shown with the understanding that the apparatus for providing the wave shapes will be described hereinafter. The voltage available for being impressed across the terminals of coil 31 in a preferred embodiment of the invention may be unfiltered full wave rectified AC voltage represented by waveshape 106 with a peak magnitude 110. The electrical current flowing through the coil 31 may be full wave rectified, unfiltered conduction angle controlled AC current pulses 108 which flow through coil 31 in accordance with Table 1. Voltage may be impressed across coil 31 as is shown at 106A, 106B, 106C, and 106D in FIG. 6. In one embodiment of the invention, the total power supplied to the magnetic coil 31 during the period between time 72' and time 96' may be provided by adjusting the amplitude of a full conduction current wave in conjunction with a known peak amplitude 110 for the voltage wave 106 so that the combination of the current and voltage which makes up the power supplied to the coil 31 will be equal over the aforementioned time period (72'-96') to the mechanical energy required to close the contacts as described previously. In another embodiment of the invention, however, as is indicated in Table 1, a gate controlled device such as a triac may be connected in series with the coil 31 in a manner to be described hereinafter with respect to FIG. 7 for rendering the coil generally non-conductive during certain predetermined portions $\alpha 1, \alpha 2$, etc. of the half wave current pulses 108 and thus for rendering the coil generally conductive for the portions represented at $\beta 1, \beta 2$, etc. for the purpose of adjusting the total power supplied to the coil 31 during the period of time (72'-96). Note that between conduction intervals some coil current flows due to the discharge of magnetically stored energy which was built up during the preceding conduction interval. In the preferred embodiment of the invention, the number of conduction angle controlled pulses of current 108 is determined by the length of time that the magnetic energy must be supplied by the coil 31 in the manner described previously. In some embodiments of the invention, the appropriate adjustment to pulses 108 may be accomplished before the time 96'and still accomplish the appropriate supply of electrical energy to the coil 31 for accelerating the armature 40 in the manner described previous. In another embodiment of the invention sufficient energy may not be available from adjustment of the current conduction cycle in the appropriate time and a necessary later adjustment may be provided in a manner to be described hereinafter. It is to be understood that the smooth curves or waves 106 and 108, for example, are illustrative of the ideal wave shapes envisioned but in actuality may deviate therefrom. In the ideal situation shown in FIG. 6, the armature 40 may be accelerated to a level of energy E as shown in FIG. 4 at time 96' sufficient to continue to compress the kickout spring 34 and contact spring 56 with ever-decreasing armature velocity until a point in time 78' is reached at which the armature 40 following curve 100 gently abuts against the magnet 36 with zero velocity as is shown in FIG. 4 In actuality, however, the attainment of such is difficult. For instance, the amount of electrical energy supplied by the combination of the voltage waveshape 106 and the conduction-controlled current waveshape 108 within the appropriate time (72'-96') may be insufficient to supply the necessary kinetic energy to the armature 40 to allow it to complete the closing cycle. This may be represented by velocity curve 100A of FIG. 4, for example, which shows the armature 40 stopping or attaining a zero velocity, before it touches the fixed magnet 36. In such a case the combination of the contact spring 56 and the kickout spring 34 would likely accelerate the armature 40 back in the other direction until the springs 34–56 had relaxed thus preventing closure of the electrical contacts mechanically interconnected with the armature 40, thus, defeating the closing of the contactor 10. As undesirable as this situation may seem, a situation in which the armature 40 almost touches the permanent magnet 36 would be even worse as the likelihood of the contacts striking an arc therebetween and subsequent contact welding is greatly increased. Recognizing that insufficient energy may be available during the appropriate time frame for accelerating the armature, a "mid-flight" correction based on new information may be necessary to "fine tune" the velocity curve of the armature 40. The time for this correction occurs during the COAST part of FIG. 6. Provision is made in the preferred embodiment of the invention for re-accelerating the armature 40 by providing an adjustment current pulse 116 at a time 118' which deviates the deceleration curve of the armature from curve 100 to curve 100B of FIG. 4 so that assured abutment of the armature 40 with the permanent magnet 36 at relatively low if not zero velocity may occur. This adjustment pulse 116 is made by providing triac firing control angle $\alpha 3$ which may be greatly larger than angles $\alpha 1$ and $\alpha 2$, for example. In a preferred embodiment of the invention, it is envisioned that angles $\alpha 1$ and $\alpha 2$ are equal although this is non-limiting and is merely a function of the control system utilized for the current conduction path for the coil 31. After the armature 40 has abutted the permanent magnet 36 at a relatively low velocity, the contactor 10 attains the status of being "closed". Since it is possible that vibration or other factors may induce contact bounce at this time which bounce is highly undesirable, the control circuit for the current in the coil 31 may be manipulated in a convenient manner as described hereinafter to provide a number of "seal-in" or GRAB pulses for the abutting armature 40 and fixed magnet 36 Since at least theoretically, the forward motion of the armature 40 has been, or will shortly be, stopped by abutment with the magnet 36, the introduction of seal-in pulses will not cause acceleration of the armature because the armature's path is physically blocked by the disposition of the fixed magnet 36. Rather all oscillations will be quickly damped Assured seal-in of the contacts is thus attained In a preferred embodiment of the invention, seal-in or GRAB may occur by allowing coil current to flow for a portion of a current half-wave represented by conduction angles $\beta4$, $\beta5$ and $\beta6$, for example, to generate seal-in or GRAB pulses 120. The ACCELERATION, COAST and GRAB operations work on the principle of feed forward voltage control In the last stage of operation, HOLD, it is recognized that the mechanical system has essentially come to rest but a certain amount of magnetism is nevertheless necessary to keep the armature 40 abutted against the fixed magnet 36 thus keeping the contacts closed A relatively small and variable hold-in pulse 124 may be repeated once each current half-cycle indefinitely for as long as the contacts are to remain closed in order to prevent the kickout spring 34 from accelerating the armature 40 in the opposite direction and thus opening the contacts The amount of electrical energy necessary to hold the armature 40 against the magnet 36 in an abutted disposition is significantly less than the amount necessary to accelerate the armature 40 towards the magnet 36 to overcome the force of the kickout spring 34 and the contact spring 56 during the closing operation. The pulse 124 may be obtained by significantly increasing the phase back, delay or firing angle to a value $\alpha7$ for example Angle $\alpha7$ may vary from current pulse to current pulse, i.e., the next delay angle $\alpha8$ may be larger or smaller than angle $\alpha7$. This may be accomplished by closed loop current control; that is, the current flowing in the coil 31 is sensed and readjusted if necessary as is further described with respect to FIG. 21.

Referring now to FIGS. 7A through 7D, an electrical block diagram for the control circuit of the present invention is shown. Coil control card 28 of FIGS. 2, 8, 9 and 10 has provided thereon the terminal block or strip J1 for connection with external control elements such as shown in FIG. 11 for example. Terminal block J1 has terminals 1 through 5 with designations "C", "E", "P", "3", and "R", respectively. Connected to terminal "2" is one end of resistive element R1, one end of a resistive element R2, and the first AC input terminal of a full-wave bridge rectifier BR1. The other end of resistive element R1 is connected to one end of a capacitive element C1, and one end of a resistive element R16. This latter electrical point is designated "120 VAC". The other end of the resistive element R2 is the "LINE" input terminal of a bipolar linear, custom, analog, integrated circuit module U1, the function of which will be described hereinafter. This latter terminal is also connected to the B40 terminal of a microprocessor U2 and to one side of a capacitance element CX, the other side of which is grounded. Module U1 is similar to apparatus described in application Ser. No. 725,179 entitled "Analog Signal Processing Circuit," and in application Ser. No. 725,050 entitled "A Supervisory Circuit for a Programmed Processing Unit," both of which were concurrently filed on Apr. 19, 1985 and both of which are assigned to the assignee of this application. Microprocessor U2 may be the kind manufactured by "Nippon Electric Co." and identified as $\mu$PD75CG33E or the kind identified as $\mu$PD7533. Connected to the second AC input terminal of the bridge rectifier BR1 are one side of a resistive element R6, the other side of which is system grounded and the anode of a TRIAC or similar gated device Q1. The other end of the capacitive element C1 is connected to the anode of a diode CR1, the cathode of a diode CR2 and the regulating terminal of a Zener diode ZN1. The cathode of the diode CR1 is connected to one side of a capacitive element C2, the other side of which is system grounded, and to the "+V" terminal of the integrated circuit U1. This latter point represents the power supply voltage VY and in the preferred embodiment of the invention is +10 VDC. The anode of the diode CR2 is connected to one side of a capacitive element C7, the other side of which is grounded. The other terminal of the Zener diode ZN1 is connected to the non-regulating terminal of another Zener diode ZN2. The other side or regulating terminal of the zener diode ZN2 is grounded The junction between the anodes of the device CR2 and the capacitive element C7 carries the power supply voltage VX which in a preferred embodiment of the invention is designated $-7$ V DC.

Input terminal "1" on terminal board J1 is grounded. Input terminal "3" on terminal board J1 is connected to one side of a resistive element R3, the other side of which is connected to one side of a capacitive element C4, to the "RUN" input terminal of the linear integrated circuit U1 and to the B41 terminal of the microprocessor U2 The other side of the capacitive element C4 is grounded Terminal "4" of terminal board J1 is connected to one side of a resistive element R4, the other side of which is connected to one side of a capacitive element C5, the "START" input terminal of the linear circuit U1 and to the B42 terminal of the microprocessor U2. The other side of the capacitive element C5 is connected to ground. Input terminal "5" of the terminal board J1 is connected to one side of a resistive element R5, the other side of which is connected to one side of capacitive element C6, the "RESET" input terminal of the linear integrated circuit U1 and to the B43 terminal of the microprocessor U2. The other side of the capacitive element C6 is connected to ground. The combination of resistive and capacitor elements R3-C4, R4-C5, and R5-C6 represent filter networks for the input terminals "3", "4" and "5" of terminal board J1, respectively. These filters in turn feed high impedance circuits represented by the inputs "RUN", "START" and "RESET", respectively, of the linear integrated circuit U1.

Across the DC or output terminals of the full wave bridge rectifier BR1 is connected the aforementioned solenoid coil 31 to be used in a manner previously described and further described hereinafter. The other main conduction terminal or cathode of the silicon-controlled rectifier or similar gated device Q1 is connected to one side of a resistive element R7 and to the "CCI" terminal of the device U1. The other side of the resistive element R7 is grounded. The gate of the silicon-controlled rectifier or similar gated device Q1 is connected to the "GATE" output terminal of the linear integrated circuit U1.

The linear integrated circuit U1 has a "+5 V" power supply terminal which is designated VZ and which is connected to the REF input terminal of the microprocessor U2, and a resistive potentiometer element R8 for adjustment. The integrated circuit module U1 has an output terminal "VDD" which is connected to the VDD input terminal of the microprocessor U2, to one side of a capacitive element C16 and to one side of a resistive element R15, the other side of which is connected to one side of a capacitive element C9 and to the "VDDS" input terminal of the linear analog module U1. The other sides of the capacitive elements C9 and C16 are grounded. The linear integrated circuit module U1 also has a ground terminal "GND" which is connected to the system common or ground. Integrated circuit U1 has a terminal "RS" which supplies the "RES" signal to the RES input terminal of the microprocessor U2. Linear integrated circuit module or chip U1 has a terminal "DM" (DEADMAN) which is connected to one side of a capacitive element C8 and to one side of a resistive element R14. The other side of the resistive element R14 is connected to the 022 terminal of the microprocessor U2. The other side of the capacitor element C8 is connected to ground. Chip or circuit U1 has a "TRIG" input terminal upon which the signal "TRIG" is supplied from the B52 terminal of the microprocessor U2. Integrated circuit U1 has a "$\overline{VOK}$" output terminal which provides the signal "$\overline{VDDOK}$" to the INTO terminal of the microprocessor U2. Finally, integrated circuit U1 has a "CCO" output terminal which provides the signal "COILCUR" to the AN2 input terminal of the microprocessor U2. Signal "COILCUR" carries an indication of the amount of coil current flowing in coil 31. Further description of the internal operation of the bipolar linear integrated circuit U1 and the operation of the variously described inputs and outputs will be provided hereinafter.

The other side of resistive element R16 is connected to the anode of a diode CR4, the cathode of which is connected to one side of a capacitive element C13, one side of a resistive element R17 and the AN3 input terminal of the microprocessor U2. The latter terminal receives the signal "LVOLT" which is indicative of line voltage for the system under control. The other side of the capacitive element C13 and the other side of the resistive element R17 are system grounded.

There is also provided on the coil control board 28 another connector or terminal block J2 having terminals upon which the following signals or functions are provided "GND" (connected to ground), "MCUR" (an input), "DELAY" (an input), "+5 V" (power supply), "+10 V" (power supply) and "−7 V" (power supply). The control signals Z, A, B, C and SW are also provided here.

The following terminals of the microprocessor U2 are grounded GND and AGND. The terminal AN2 of the microprocessor U2 is connected to the "MCUR" terminal of the terminal board J2. Terminal CL2 of microprocessor U2 is connected to one side of a crystal Y1, the other side of which is connected to terminal CL1 of the microprocessor U2. Terminal CL2 is also connected to one side of the capacitive element C14. Terminal CL1 is also connected to one side of capacitive element C15. The other sides of the capacitive elements C14 and C15 are connected to system ground. Terminal DVL of microprocessor U2 is connected to the "+5 V" terminal on terminal board J2.

The linear analog circuit U1 internally includes a regulated power supply RPS, the input of which is connected to the "+V" input terminal and the output of which is connected to the "+5 V" output terminal. In a preferred embodiment of the invention, the unregulated 10 volt value VY is converted within the regulated power supply RPS to the highly regulated 5 volt signal VZ or +5 V. In addition, an internal output line COMPO for the regulated power supply RPS which in a preferred embodiment of the invention may be 3.2 volts is supplied to the reference terminal (−) of a comparator COMP. One input (+) of the comparator COMP is provided with the VDDS signal. The output of the comparator COMP is designated $\overline{VOK}$. The input terminals designated "LINE", "RUN", "START" and "RESET" are connected to a clipping and clamping circuit CLA in the linear integrated circuit U1 which in a preferred embodiment of the invention limits the range of the signal supplied to the microprocessor U2 to between +4.6 volts positive and −0.4 volts negative regardless of whether the associated signal is a DC voltage or an alternating voltage signal Internal of the linear circuit U1 is a gate amplifier circuit GA which receives its input from the "TRIG" input and supplies the GATE output. Furthermore, a DEADMAN and reset circuit DMC which is interconnected to receive the DEADMAN signal "DM" and to provide the reset signal RES at "RS" also provides an inhibit signal for gate amplifier GA at "I" such that the gate amplifier GA will produce no gating signal GATE if the DEADMAN function is occurring. There is also provided a coil current amplifier CCA which receives the coil current signal from terminal "CCI" and provides the output signal COILCUR at terminal CCO for utilization by the microprocessor U2 in a manner to be described hereinafter. The description of the functions provided by the microprocessor U2 at the various input and output terminals thereof will be described hereinafter.

There is also provided the overload relay board 60 which includes a connector J101 and connector J102 which are complementary with and connectable to the connector J2 on coil current control board 28 by way of a cable 64. The previously-mentioned current-to-voltage transducer former 62 may be represented by three transformers 62A, 62B and 62C, respectively for a three-phase electrical system which is controlled by the overload relay board 60. One side of each of the secondary windings of these current-to-voltage transducers 62A, 62B and 62C is grounded while the other side is connected to one side of a resistive element R101, R102 and R103, respectively. There is also provided a triple two-channel analog multiplexer/demultiplexer or transmission gate U101 having terminals aOR, bOR and cOR connected to the other sides of resistive elements R101, R102 and R103, respectively. The ay, by and cy terminals of gate U101 are connected to ground. Terminals ax, bx and cx of gate U101 are all tied together electrically and connected to one side of an integrating capacitor C101 and the anode of a rectifier CR101. The other side of the capacitor C101 is connected to the cathode of a rectifier CR102, the anode of which is connected to the cathode of the aforementioned rectifier CR101, to the output of a differential amplifier U103 and to the bOR terminal of a second triple two-channel analog multiplexer/demultiplexer U102. The other side of the integrating capacitor C101 is also connected to the positive input terminal of a buffer amplifier with gain U105 and to the cOR output terminal of the aforementioned second analog multiplexer/demultiplexer or transmission gate U102. The aforementioned joined terminals ax, bx and cx of transmission gate U101 are also connected to the ay and cx terminals of the transmission gate U102. The ax terminal of the transmission gate or analog multiplexer/demultiplexer U102 is connected to ground. The aOR terminal of the device U102 is connected to one side of a capacitive element C102, the other side of which is connected to the bx terminal of the multiplexer/demultiplexer U102 and to the negative input terminal of the aforementioned differential amplifier U103. The positive input terminal of the aforementioned differential amplifier U103 is grounded. The negative input terminal of the differential amplifier U105 is connected to the wiper of a potentiometer P101, one main terminal of which is grounded and the other main terminal of which is connected to provide the "MCUR" output signal to the terminal board J102. This latter signal is provided from one side of a resistive element R103, the other side of which is connected to the output of the differential amplifier U105, the anode of a diode CR104 and the cathode of a diode CR105. The anode of the diode CR105 is connected to ground and the cathode of the diode CR104 is connected to the −5 V power supply terminal VZ. Devices U101, U102 and U103 are supplied from the −7 power supply. The +10 V power supply voltage is supplied to the aforementioned amplifier-with-gain U105 and to one side of a resistive element 104, the other side of which is connected to supply power to the aforementioned transmission gates U101 and U102 as well as the anode of a diode CR106, the cathode of which is connected to the +5 V power supply voltage. The +5 V power supply level VZ on terminal board J102 is also supplied to one side of filter capacitive element C103, the other side of which is grounded and to one main terminal of a potentiometer P102, the other main terminal of which is grounded. The wiper of the potentiometer P102 is connected to provide the "DELAY" output signal on terminal board J101 and thence to terminal ANO of microprocessor U2. The control terminals A, B and C of the aforementioned analog multiplexer/demultiplexer device U101 are connected to the A, B and C signal terminals, respectively, of a parallel to serial eight-bit static shift register U104. Signals A, B and C come from terminals 032, 031 and 030, respectively, of microprocessor 42.

There is provided an eight-pole switch SW101 with the following designations: AM, C0, C1, SP, H0, H1, H2, and H3. One end of each of the switch poles is grounded while the other end of each is connected to the 5 volt power supply VZ by way of the P0 through P7 input terminals of the parallel to serial eight-bit static shift register U104, the "COM" output terminal of which receives the "SW" signal from terminal board J101 and the terminal I10 of microprocessor U2. The previously described designations "H0" through "H3" represent "heater" classes for the types of devices controlled by the overload relay board 60. Proper manipulation of any or all of the latter four poles in switch SW101 provides a convenient way to represent the heater class of the device protected by the overload relay board 60.

Referring now to FIGS. 2, 8, 9 and 10, construction features of the printed circuit board which is utilized to make the coil control board 28 and the overload relay board 60 are illustrated and described. In particular, the terminal block J1 is shown disposed upon the coil control board 28. Also shown disposed upon the coil control board 28 is the coil assembly 30 (without coil). The coil control assembly 30 includes the spring seat arrangement 32 and a coil seat arrangement 31A. There is also disposed on the coil control board 28 the connector J2 into which is soldered or otherwise disposed one end of the flat ribbon cable 64. Flat ribbon cable 64 is terminated at the other end there of at the connectors J101 and J102 on the overload relay board assembly 60. The three-phase current transducers or transformers 62, depicted as 62A, 62B, 62C in FIG. 8 for three-phase electrical current, are shown on the overload relay board 60. There is provided the switch SW101 which is an 8-pole dip switch. Also shown are the potentiometers P101 and P102 for factory calibration and time delay adjustment, respectively.

In a preferred embodiment of the invention, the coil control board 28 and the overload relay board 60 may be formed on one piece of preshaped, soldered and connected printed circuit board material. The single piece of printed circuit board material is then separated at region 100 by breaking the isthmus 102, for example, to form a hinged right angle relationship between the overload relay board 60 and the coil control board 28, depicted best in FIGS. 2 and 10.

Referring now to FIG. 2 and FIG. 11, an illustration and exemplary but non-limiting control arrangement utilizing the apparatus and electrical elements of the coil control board 28 and the overload relay board 60 is shown. In particular, there are provided three main power lines—L1, L2, L3—which provide three-phase AC electrical power from a suitable three phase power source. These lines are fed through contactors MA, MB, MC respectively. The terminal board J1 is shown with its terminals designated: "C", "E", "P", "3" and "R". These designations represent the functions or connections: "COMMON", "AC POWER", "RUN PERMIT/STOP", "START-REQUEST", and "RESET", respectively. As was shown with respect to FIGS. 8, 9, 10 for example, the coil control board 28 communicates with the overload relay board 60 by way of the multipurpose cable 64. The overload relay board 60 has, among other things, the switch SW101 thereon which performs the functions described previously. In addition, the secondary windings of the current transducers or transformers 62A through 62C are shown interconnected with the overload relay board 60. The transducers 62A through 62C monitor the instantaneous line currents iL1, iL2 and iL3 in lines L1, L2, L3, respectively, which are drawn by a MOTOR interconnected with the lines L1, L2, L3 by way of terminals T1, T2, T3, respectively. Power is provided to the coil control board 28 and the overload relay board 60 by way of a transformer CPT, the primary winding of which is connected across lines L1, L2, for example. The secondary winding thereof is connected to the "C" and "E" terminals of the terminal board J1. One side of the secondary winding of the transformer CPT may be interconnected to one side of a normally closed STOP pushbutton and one side of a normally open RESET pushbutton. The other side of the STOP pushbutton is connected to the "P" input terminal of the J1 terminal board and to one side of a normally opened START pushbutton. The other side of the normally open START pushbutton is connected to the "3" input terminal of the terminal board J1. The other side of the RESET pushbutton is connected to the reset terminal R of the terminal board J1. The aforementioned pushbuttons may be manipulated in a manner well known in the art to provide control information to the coil control board 28 and overload relay board 60.

Referring now to FIGS. 2, 7C and 12 through 18, the construction and operation features of various kinds of current transformers or transducers 62 associated with the present invention are described. Conventional prior art current sensing transformers produce a secondary winding current which is proportional to the primary winding current. When an output current signal from this type of transformer is fed to a resistive current shunt and voltage across the shunt is provided to a voltage-sensing electronic circuit such as might be found in the overload relay board 60, a linear relationship between input and output exists. This voltage source then can be utilized for measurement purposes. On the other hand, air-core type transformer, sometimes called liner couplers, may be used for current-sensing applications by providing a voltage across the secondary winding which is proportional to the derivative of the current in the primary winding. The conventional iron-core current transformer and the linear coupler have certain disadvantages. One is that the "turns-ratio" of the conventional transformer must be varied to change the output voltage for a given current transformer design. In the current transformers or transducers described with respect to the present invention, the rate of change with respect to time of the magnetic flux in the magnetic core of the transducer is proportional to the current in the primary winding absent flux saturation in the core. An output voltage is produced which is proportional to the derivative of the current in the primary winding, and the ratio of the output voltage to current is easily changed for various current-sensing applications. Iron core transformers tend to be relatively large. The transformer of the present invention may be miniaturized.

Figure 12:
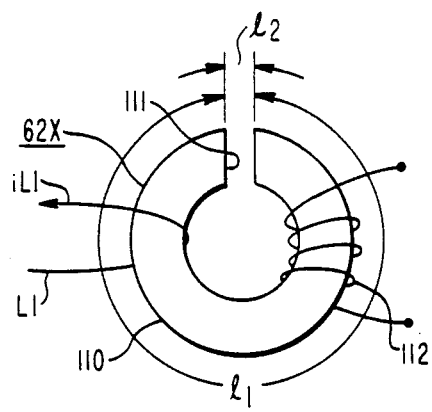
FIG. 12 shows a schematic arrangement of a current-to-voltage transducer for utilization in an embodiment of the present invention.
Figure 15:
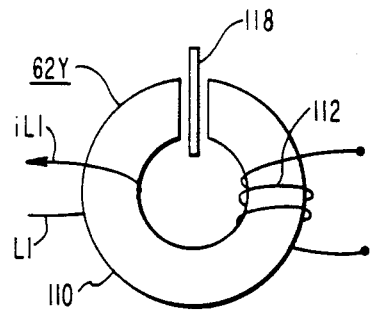
FIG. 15 shows an embodiment of a current-to-voltage transducer utilizing a magnetic shim.
Figure 16:
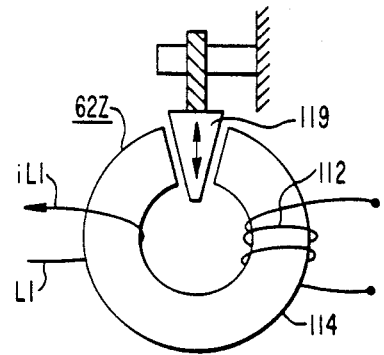
FIG. 16 shows an embodiment of a current-to-voltage transducer using an adjustable protrusion member.
Figure 17:
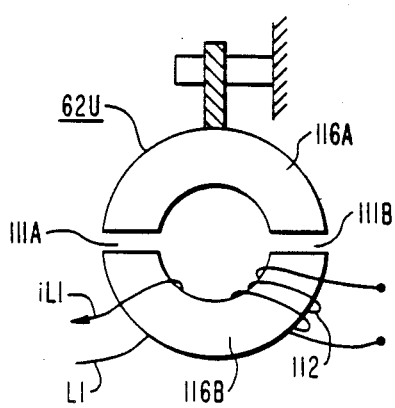
FIG. 17 shows an embodiment of a current-to-voltage transducer utilizing a movable core portion.

Referring specifically to FIG. 12, a transformer 62X of the present invention may comprise a toroidal magnetic iron core 110 with a substantial discrete air gap 111. The primary current iL1, i.e., the current to be sensed, passes through the center of the core 110 and hence provides a single turn input primary winding for the line L1. The secondary winding 112 of the transformer 62X comprises multiple turns which may, for the purposes of illustration, be designated as having N2 turns. The secondary winding 112 has sufficient turns to provide a voltage level which is sufficient to drive electronic circuitry which monitors the transformer or transducer. The circumferential length of the iron core 110 is arbitrarily chosen for purposes of illustration as $l_1$ and the length of the air gap 111 is arbitrarily chosen as $l_2$. The cross-sectional area of the core is designated $A_1$ and the cross-sectional area of the air gap is designated $A_2$. The output voltage of the transformer is varied by changing the effective length of the air gap $l_2$. This can be accomplished by either inserting metallic shims into the air gap 111 as is shown in FIGS. 15 and 16, or by moving separate portions of the core structure of the transformer as shown in FIG. 17, to provide a relatively smaller or larger air gap 111. Once the length of the air gap 111 has been chosen, a relatively small current-sensing transformer or transducer is formed which produces an output voltage $e_0(t)$ which is generally proportional to the derivative of the input current iL1 in the input winding of the transformer. One advantage of this arrangement is that it is not limited to use on sinusoidal or even periodic input currents. However for purposes of simplicity of illustration the following will be described with a sinusoidal input current. The output voltage $e_0(t)$ produced by the secondary winding of the transformer or transducer 62X shown in FIG. 12, for example, is given by Equation (1):

$$e_0(t) = \frac{N1\,N2}{\frac{l_1}{\mu_1 A_1} + \frac{l_2}{\mu_2 A_2}} \frac{d}{dt} (I_{L1} \sin \omega t) \quad (1)$$

The terms $\mu_1$ and $\mu_2$ are the magnetic permeability of the core 110 and air gap 111, respectively. $\omega$ (omega) is the frequency of the instantaneous current iL1 and $I_{L1}$ equals the peak magnitude of the instantaneous current iL1. For applications where all parameters remain constant except the length of the air gap $l_2$ and the applied frequency $\omega$, equation (1) reduces to equation (2):

$$e_0(t) = \frac{N1\,N2}{k_1 + k_2 l_2} [\omega I_{L1} \cos \omega t] \quad (2)$$

where the bracketed term is equivalent to the derivative portion of Equation (1).

Figure 13:
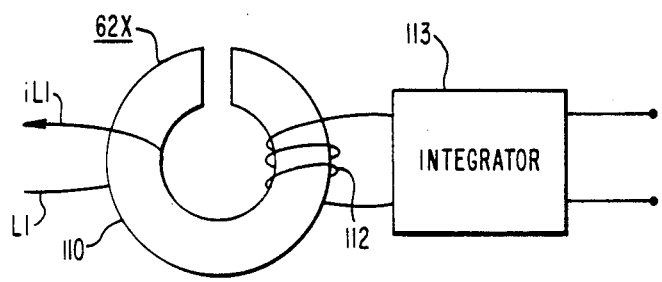
FIG. 13 shows a schematic arrangement of the transformer of FIG. 12 with an integrator circuit.

If the voltage $e_0(t)$ of equation (2) is supplied to the terminals of an integrating circuit or integrator such as 113 shown in FIG. 13 which, in a preferred embodiment of the invention, may be as shown in FIG. 7, equation (3) applies at the output of the integrator 113.

$$e_0'(t) = \frac{N1\,N2}{k_1 + k_2 l_2} I_{L1} \sin \omega t \quad (3)$$

Figure 14:
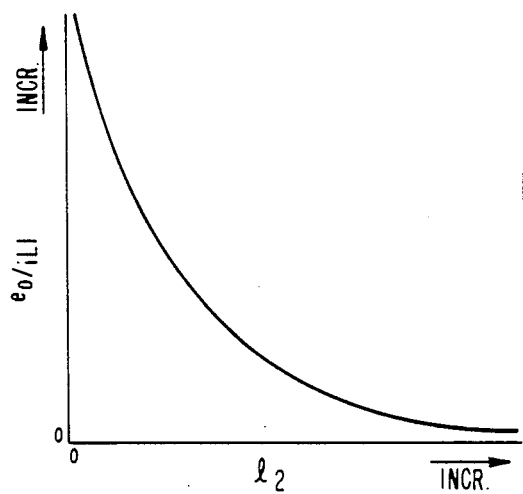
FIG. 14 shows a plot of air gap length versus the voltage-to-current ratio for the transducer arrangements of FIGS. 12 and 13.

As the length $l_2$ of the air gap 111 is varied, the output voltage $e'_0(t)$ which is now directly proportional to the input current iL1 will vary in inverse proportion to the length $l_2$ of the air gap 111. FIG. 14 shows a typical plot of the output voltage $e'_0(t)$ divided by the input current (iL1 for example) for variations in the length 111 of the air gap $l_2$. In a special case where the primary frequency w remains constant or is assumed to be constant, the use of the integrating circuit or integrator 113 of FIG. 13 may be eliminated. In this case, equation (2) can then be depicted as shown in equation (4).

$$e_0(t) = \frac{k_4}{k_1 + k_2 l_2} I_{L1} \cos \omega t \quad (4)$$

where the constant frequency term $\omega$ forms part of k4. In this case the output $e_0(t)$ from the transformer secondary winding 112 is proportional to the input current $I_{L1}$ and varies inversely with the length $l_2$ of the air gap 111.

Referring specifically to FIGS. 15, 16, 17, in applications where it is desirable to use the same current transformer or transducer for sensing several ranges of current, the output voltage $e_0(t)$ may be varied by effectively changing the length $l_2$ of the air gap 111. This is accomplished by inserting a shim in the air gap of the transformer 62Y of predetermined width, depending upon the range of output voltage $e_0(t)$ desired. Alternately, a wedge-shaped semicore 119 may be inserted into the air gap 111 of the transformer 62Z for accomplishing the same purpose; and finally, the core of the transformer may be cut into two sections—116A, 116B—for the transformer 62U of FIG. 17 to accomplish the same purpose, by providing two complementary air gaps 111A, 111B. FIGS. 12-17 teach a current-to-voltage transformer which has a primary winding disposed on a magnetic core for providing magnetic flux in the magnetic core in general proportion to the amount of electrical current flowing in the primary winding. The magnetic core has a discrete but variable air gap. The discrete but variable air gap has a first magnetic reluctance which prevents magnetic saturation of the magnetic core for values of electrical current which are less than or equal to a value I1. There is also provided a secondary winding which is disposed on the magnetic core for producing an electrical voltage V at the output terminals thereof which is generally proportional to the magnetic flux in the magnetic core. Voltage V is less than or equal to voltage V2 for the first magnetic reluctance and for values of current I less than or equal to I1. The variable but discrete air gap is changeable to provide a second and higher value of air gap reluctance which prevents magnetic saturation of the magnetic core for values of electrical current I less than or equal to I2 where I2 is greater than I1. The voltage V remains less than or equal to V1 for the second value of air gap reluctance and for values of current less than or equal to I2.

Figure 18:
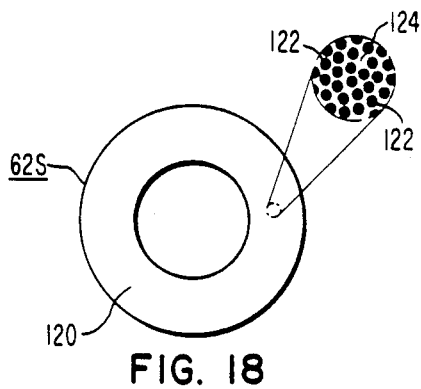
FIG. 18 shows an embodiment of a current-to-voltage transducer utilizing a powdered metal core.

Referring specifically to FIG. 18, a homogeneous magnetic core 120 for a transformer 62S may be provided which apparently has no large discrete air gap 111, but which, in fact, is comprised of sinterad or compressed powdered metal such as but not limited to ferrite in which microscopic clumps or quantrums of magnetically conductive core material 122 with homogeneously or evenly distributed air gaps 124. This has the same effect as a discrete air gap such as 111 shown in FIG. 12 but reduces the effect of stray magnetic field influences and provides a very reliable and small transformer. This type of transformer may be formed by compressing powdered metal or otherwise forming it into a core shape which has sections of powdered metal 122 and the air gaps or interstices 124 microscopically and evenly distributed around the body thereof. Thusly constructed, the magnetic core need not saturate, thus providing an output voltage which is proportional to the mathematical derivative of the excitation current. In one embodiment of the invention, non-magnetic insulating material is disposed in the afore-mentioned interstices.

Figure 19:
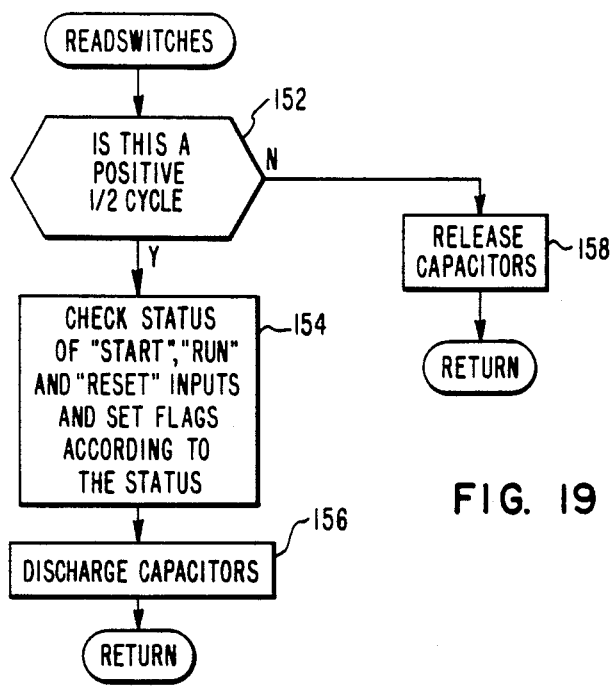
FIG. 19 shows an algorithm, READSWITCHES, in block diagram form for utilization by a microprocessor for reading switches and discharging capacitors for the input circuitry of the coil control board of FIG. 7.

Referring now to FIGS. 7A through 7D, FIGS. 11, 19, 20 and 21, the operation of the system will be described. The system line voltage (see VAB of FIG. 11 for example) is represented by the LINE signal which is utilized to provide synchronization of the microprocessor U2 with the AC line voltage. This generates the various power supply voltages VX, VY, VZ for example. The deadman circuit DMC which is also utilized as a power-on reset circuit initially provides a 5 volt 10 millisec reset signal RES to the microprocessor U2. This signal initializes the microprocessor U2 by placing its outputs at high impedance level and by placing its internal program at memory location 0. Switch inputs are read via the inputs B41-B43. The algorithm is shown in FIG. 19. Normally terminals B41, B42 and B43 are input terminals for the microprocessor U2 but also are configured as output terminals to provide discharge paths for the aforementioned capacitors for the discharge purpose previously described. The reason for this is as follows. Whenever the input pushbuttons are open, C4, C5 and C6 may become charged as described previously or by leakage currents emanating from the microprocessor. The leakage currents will charge the capacitors to voltage levels that may be falsely interpreted as logic 1. Therefore, it is necessary to periodically discharge the capacitive elements C4, C5 and C6. The "READSWITCHES" algorithm of FIG. 19. Logic block 152 asks the question: Is the line voltage as read from the line signal LINE at the B40 input terminal of the microprocessor U2 in a positive half-cycle?". If the answer to that question is "Yes", then logic block 154 is utilized which essentially checks to see if the "START", "RUN" and "RESET" signals at the input terminals B41, B42 and B43, respectively, are at digital ones or digital zeros. Regardless of the answer, when the aforementioned questions have been asked, the next step in the algorithm is shown in function block 156 which issues the following command: "DISCHARGE CAPACITORS". At this point the terminals B41 through B43 of the microprocessor U2 have zeros placed internally thereon to discharge the capacitors as described previously. This occurs during a positive half cycle of the line voltage. If the answer to the question posed in function block 152 is "No", then the line voltage is in the negative half cycle and it is during this half cycle that the input terminals B41 through B43 are released from the capacitor discharging mode. Although the foregoing is described for a motor control apparatus, the concept may be used by apparatus for detecting the presence of an AC voltage signal.

After initialization has taken place, the microprocessor U2 checks the input terminal INT0 thereof to monitor the status of the $\overline{VOK}$ output signal from the linear integrated circuit U1. This signal will be at a digital zero if the voltage on the internal random access memory RAM of the microprocessor U2 is sufficiently high to guarantee that any previously stored data therein is still reliable. The capacitive element C9 monitors and stores the random access memory power supply voltage VDD. After the voltage VDD has been removed, for example by interruption of the power supply for the entire system during a power failure, the capacitive element C9 will maintain voltage VDD thereacross for a short period of time but will eventually discharge. The voltage across the capacitive element C9 is VDDS and is fed back or supplied to the linear integrated circuit U1 in the manner described previously. It is this voltage which causes the output signal $\overline{VOK}$ to be either digital one which is indicative of too low a value for the voltage VDD or a digital zero which is indicative of a safe value for voltage VDD.

The microprocessor U2 also receives an input signal LVOLT at input terminal AN3 thereof. This signal appears across R17. This voltage which ranges from 0 to 5 volts is proportional to the voltage on the control line LINE. The microprocessor U2 uses this information three ways: (1) It is utilized to select the closing profile for the contacts of the contactor 10 in a way which was described previously with respect to FIG. 6. A proper coil closing profile varies with line voltage. The signal LVOLT thus provides line voltage information to the microprocessor U2 so that the microprocessor U2 can act accordingly to change the firing phase or delay angles, $\alpha 1$, $\alpha 2$, etc. for the triac or similar gated device Q1 if the line voltage varies. (2) The LVOLT signal is also utilized to determine whether or not the line voltage is sufficiently high to permit the contactor 10 to close at all (refer to Table 1). There is a value of line or control voltage below which it is unlikely that a reliable closing operation will occur. That voltage tends to be 65% of nominal line voltage. In a preferred embodiment of the invention, this is chosen to be 78 VAC. (3) Finally, the LVOLT signal is utilized by the microprocessor to determine if a minimum voltage value is present below which there is a danger of not logically opening the contacts at an appropriate time.. This voltage tends to be 40% of maximum voltage. If the line voltage signal LVOLT indicates that the line voltage is below 50% of the maximum value, the microprocessor U2 will automatically open the contacts to provide fail safe operation. In a preferred embodiment of the invention, this is chosen to be 48 VAC. The microprocessor U2 reads the LVOLT signal according to the "READ VOLTS" algorithm of FIG. 20.

Figure 20:
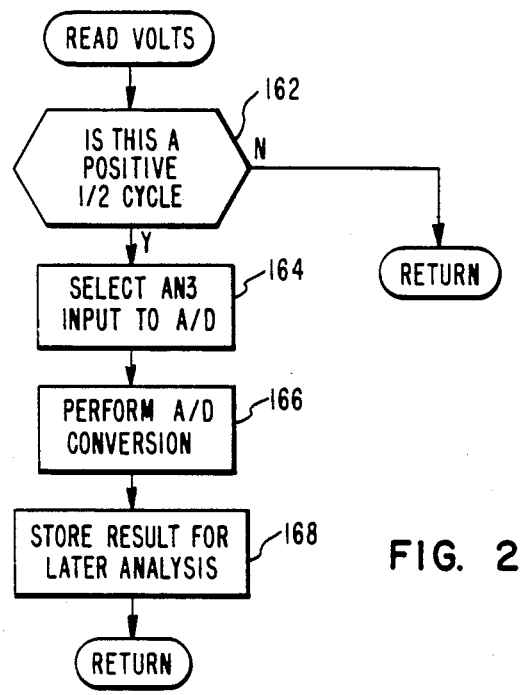
FIG. 20 shows an algorithm, READVOLTS, in block diagram form for reading line voltage for the coil control board of FIG. 7.

The LVOLT signal is utilized in the "READ-VOLTS" algorithm of FIG. 20. A decision block 162 asks the question "Is this a positive voltage half cycle?". The question is asked and answered in the same manner associated with the question in decision block 152 associated with FIG. 19. If the answer to the question in decision block 162 is "No", then the algorithm is exited. If the answer is "Yes", then command block 164 orders the microprocessor to select the AN3 input of the microprocessor U2 to perform an analog-to-digital conversion on the signal there present in correspondence with the command block 162. This information is then stored in the memory locations of the microprocessor U2 according to command block 168 for use in a manner described previously and the algorithm is exited.

Referring again to Table 1, the next input for the microprocessor is designated COILCUR. This is part of a closed loop coil current control scheme. The input CCI for the linear circuit U1 measures the current through coil 31 as a function of the voltage drop across the resistive element R7. This information is appropriately scaled as described previously and passed along to the microprocessor U2 by way of the COILCUR signal. Just as it is necessary to know the voltage on the line as provided by the LVOLT signal, it is also desirable to know the current through the coil 31 as provided by the COILCUR signal.

Figure 21:
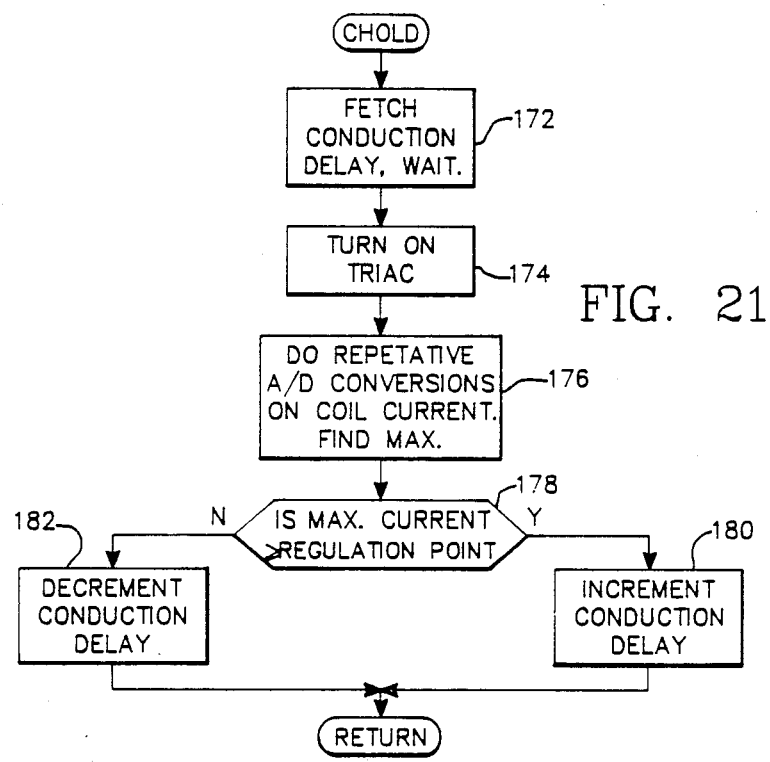
FIG. 21 shows an algorithm, CHOLD, in block diagram form for reading the coil current for the coil control circuit of FIG. 7.

The COILCUR signal is utilized in accordance with the "CHOLD" algorithm shown in FIG. 21. The first thing that is done is outlined in command block 172 where the microprocessor is ordered to fetch a supplementary conduction delay which angle $\alpha 7$ is the sum of the fixed predetermined conduction angle delay which might be 5 milliseconds and the supplementary component. The microprocessor U2 then waits until the appropriate time, that is until the point in time at which angle $\alpha 7$ has passed and fires the triac or silicon controlled device Q1 in accordance with the instructions of command block 174. The microprocessor does this by issuing the "TRIG" signal from terminal B52 thereof and passes this signal in a manner described with respect to FIGS. 7A and 7B to the integrated circuit U1 at the TRIG input terminal thereof, through the amplifier GA and to the GATE output terminal thereon for energizing the gate of the silicon controlled rectifier triac or similar gated device Q1. Then in accordance with command block 176 the electrical current flowing through resistive element R7, as measured at the CCI input of the semicustom integrated circuit U1, is passed through the amplifier CCA thereof to the CCO output as the COILCUR signal for terminal AN2 of microprocessor U2. The microprocessor then does a repetitive analog-to-digital conversion of the COILCUR signal to determine its maximum value. Then in accordance with the decision block 178, this maximum current is compared in the microprocessor U2 against a regulation point which is provided to the microprocessor U2 for determining if the maximum current is greater than the current determined by the regulation point or not. In a preferred embodiment of the invention the regulation point peak current is selected so that a DC component of 200 milliamps results. Angle $\alpha 7$ is changed if necessary to preserve this level of excitation. If the answer to the question posed by decision block 178 is "Yes", then conduction delay is incremented upwardly digitally within the microprocessor to the next higher value. This is done by incrementing a counter by one least significant bit at a time. This causes the delay angle $\alpha 7$, for example of FIG. 6, to become larger so that the current pulse 124 becomes smaller, thus reducing the average current per half cycle through the triac or similar gated device Q1. On the other hand, if the answer to the question posed in decision block 178 is "No", then the delay angle $\alpha 7$ is reduced by decrementing a counter within the microprocessor by one least significant bit, thus enlarging the current pulse 124. Regardless of the answer to the question posed in function block 178, after the increment or decrement action, as the case may be, required by command blocks 180 and 182, respectively, has been finished, the algorithm is exited for utilization again later on in a periodic manner. The net effect of changing $\alpha 7$ each half cycle if necessary is to keep the coil current at the regulation value during the HOLD stage regardless of how the driving voltage or coil resistance charge.

The inputs LVOLT and COILCUR are significant values for determining the time at which the trigger signal TRIG is provided by output B52 of the microprocessor U2 to the trigger input TRIG on the linear circuit U1. It will be remembered that the trigger signal TRIG is utilized by the linear circuit U1 in a manner described previously to provide the gate output signal GATE at the gate terminal of thyristor Q1 in a manner described previously.

Referring now to FIGS. 22, 23, 24 and 25 as well as FIGS. 7A through 7D the apparatus and method for detecting and measuring line current iL1, iL2 and iL3 is taught. With regard to the transmission gate U101, its ax, bx and cx output terminals are tied together and to one side of the integrating capacitor C101. The microprocessor U2 provides signals A, B and C to the related inputs of the transmission gate U101 in accordance with the digital arrangement shown in Table 2 to control parameter selection in switch U101. The net effect of this operation is to sequentially sample the secondary winding voltage of current transformers or transducers 62A, 62B or 62C in 32 half-line cycle increments. The integrating capacitor C101 is charged in a manner to be described hereinafter. As was described previously, the output voltages across the secondary winding of the current transformer. 62A, 62B and 62C are related to the mathematical differential of the line currents iL1, iL2 or iL3 flowing in the main lines A, B and C, respectively. Since this voltage is converted to a charging current by impressing it across a resistive element R101, R102 or R103 respectively, the voltage $V_{C101}$ across the integrating capacitor C101 correspondingly changes with each successive line cycle. The capacitor is not discharged until after the 32-line cycles of integration in a manner to be described hereinafter.

TABLE 2

| U101 Logic Input | | | Current |
|---|---|---|---|
| C | B | A | Sensed |
| 1 | 1 | 0 | $i_{LA}$ |
| 1 | 0 | 1 | $i_{LB}$ |
| 0 | 1 | 1 | $i_{LC}$ |

TABLE 2-continued

| U101 Logic Input | | | Current |
|---|---|---|---|
| C | B | A | Sensed |
| 0 | 0 | 0 | $i_{GRD}$ |

The transmission gate U102 operating in conjunction with the $\overline{Z}$ input signal rearranges the interconnection of the integrating circuitry in which the integrating capacitor C101 is placed for periodically re-initializing the circuit operation. This happens when $\overline{Z}=$zero. The output voltage $V_{C101}$ across the integrating capacitor C101 is provided to the buffer amplifier with gain U105 for creating the signal MCUR which is provided to the AN1 input terminal of the microprocessor U2. The microprocessor U2 digitizes the data provided by the signal MCUR in a manner associated with the "RANGE" algorithm of FIG. 22 The voltage signal MCUR is provided as a single analog input to an eight-bit five-volt A-to-D (analog-to-digital) converter 200 which is an internal part of the microprocessor U2. The A-to-D converter 200 is shown in FIG. 23. It is desired to utilize the system of the present invention to be able to measure line currents which vary over a wide range depending upon the application. For example, it may be desirous in some stages to measure line currents as high as 1,200 amperes, whereas in other cases it may be desirous to measure line currents which are less than 10 amperes. In order to extend the dynamic range of the system the microprocessor U2 expands the fixed eight-bit output of the A-to-D converter 200 within the microprocessor U2 to twelve bits.

For purposes of simplicity of illustration, the previously described operation will be set forth in greater detail with illustrative examples associated with the sensing current transformer or transducer 62A and resistor R101. It is to be understood that transducer 62B and resistor R102 and transducer 62C and resistor 103 respectively could be utilized in the same manner. Further it is to be understood that $$e_0(t) \sim \frac{di(t)}{dt}$$

is true for any current function. Presuming that the length 12 of air gap 111 in transducer 62A is fixed for a particular application (or that the transformer 62S of FIG. 18 is utilized) and presuming that i(t) is sinusoidal, i.e. $I_{L1} \sin \omega t$, the output voltage for the transducer as originally defined by Equation (1) may be rewritten in the form shown in Equation (5).

$$e_0(t) = \frac{K_5 \, d(I_{L1} \sin \omega t)}{dt} \tag{5}$$

The output voltage $e_0(t)$ is impressed across the resistor R101 for conversion into a charging current iCH for the integrating capacitor C101 according to Equation (6). A plot of this expressed in per units (P.U.) is shown in FIG. 25B.

$$iCH = \frac{e_0(t)}{R101} = \frac{K_6 \, d(I_{L1} \sin \omega t)}{dt} \tag{6}$$

It is important to remember that the charging current iCH for the integrating capacitor C101 is proportional to the derivative of the line current iL1 rather than the line current itself. Consequently, as set forth in Equation (7), the voltage $V_{C101}$ across the capacitive element C101 which exists as the result of the flow of the charging current iCH(t) during negative half cycles thereof may be expressed as $$V_{C101} = \left(\frac{1}{C101}\right)\left(\frac{K_6}{R_{101}}\right)\int \frac{d(I_{L1} \sin \omega t) \, dt}{dt} \tag{7}$$

$$V_{C101} = -K_7 I_{L1} \sin \omega t \tag{8}$$

Equation (8) shows Equation (7) in a more simplified form. A plot of $I_{L1} \sin \omega t$ expressed in per units (P.U.) is shown in FIG. 25A; the plot of the derivative of iL1 sin wt, after integration by capacitor C101, i.e. $-K_7 I_{L1} \sin \omega t$ expressed in per units (P.U.) is incorporated into FIG. 25C. The current iCH for charging the capacitive element C101 comes from the output terminal ax of the transmission gate U101. This current is provided to the transmission gate U101 at the aOR input terminal and is chosen in accordance with appropriate signals on the A, B, C control terminals of the transmission gate U101 (see Table 2). In a like manner the current from the transducer 62B could have been utilized by choosing the bOR-bx terminal arrangement and the transducer 62C could have been utilized by choosing the cOR-cx terminal arrangement. Terminals ax, bx and cx are tied or connected together into a single lead which supplies charging current to integrating capacitor C101. This latter common line is interconnected with the ay and cx terminals of the transmission gate U102. The ax terminal of the transmission gate U102 is grounded and the aOR common terminal is connected to one side of a capacitor C102. The cOR terminal is connected to the other side of the capacitor C101. The bx terminal of the transmission gate U102 is connected to the negative input terminal of the operational amplifier U103 and the associated bOR common terminal is connected to the output of the operational amplifier U103. Normally, the diode arrangement CR101-CR103 is such that during the integrating operation, positive half cycles of the integrating current lCH bypass the integrating capacitor C101 by way of the bridge arrangement which includes the diodes CR101 and CR102 and the output of the operational amplifier U103, but negative half cycles thereof charge the capacitive element C101 to the peak value of the appropriate half cycle. The capacitive element C101 is repeatedly charged to increasingly higher values of voltage, each one corresponding to the peak value of the negative half cycle of the charging current.

It is not unusual for a small voltage, in the order of 0.25 millivolts, to exist between the negative and positive input terminals of the operational amplifier U103. Capacitive element C102 is periodically charged to the negative of this value for creating a net input offset voltage of zero for the amplifier U103 the charging current iCH.

Figure 22:
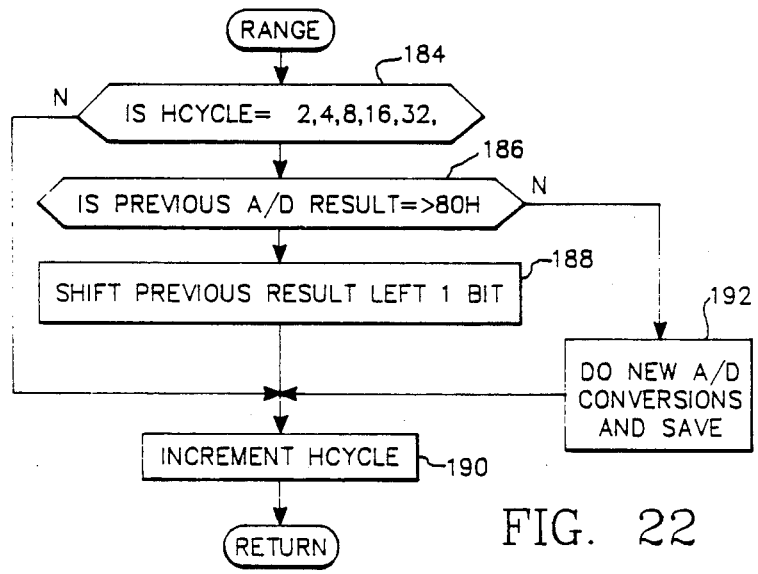
FIG. 22 shows an algorithm, RANGE, in block diagram form for reading line current as determined by the overload relay board of FIG. 7.
Figure 23:
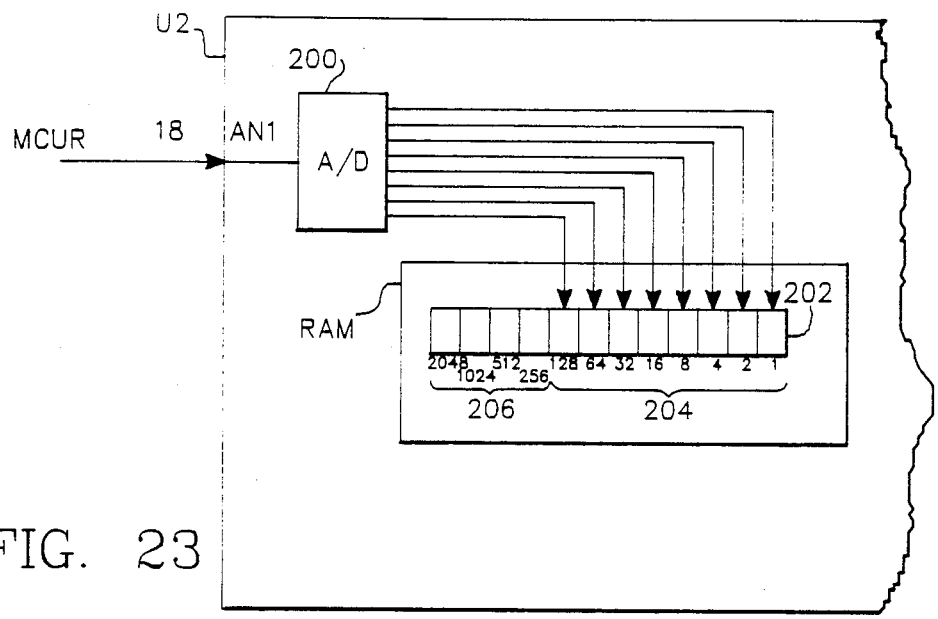
FIG. 23 shows a schematic representation of an A-to-D converter and storage locations associated with determining line current as found in the microprocessor of the coil control board of the present invention.
Figure 24:
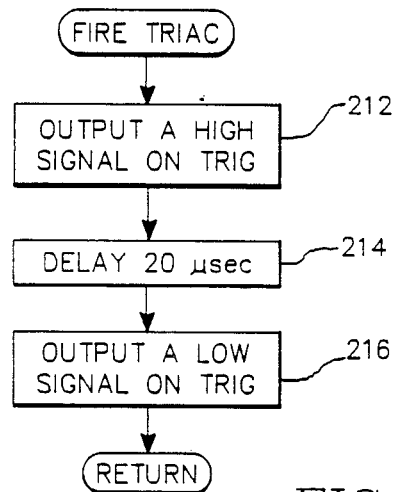
FIG. 24 shows an algorithm, FIRE TRIAC, in block diagram form for utilization by a microprocessor for firing the coil controlling triac for the coil control board of FIG. 7.

Referring now to FIG. 22, FIG. 23 and FIG. 25, the "RANGE" algorithm of FIG. 22 operating in conjunction with the integrating circuit described previously which includes the capacitive element C101 and the microprocessor U2 is described with illustrative examples. It is important to remember that dynamic range for sensing line current is important. However, as is well shown in FIG. 23, the analog-to-digital converter 200 within the microprocessor U2 has a maximum input voltage beyond which a reliable digital output number cannot be guaranteed. In a preferred embodiment of the invention, the A-to-D converter 200 can accept input voltages up to 5 volts positive for producing an 8-bit signal for provision to the first eight locations, 204, of an accumulator or storage device 202 which is located in the memory of the microprocessor U2. In such a case, the maximum five volts input is represented by a decimal number of 256 which corresponds to digital ones in all eight locations of portion 204 of accumulator 202.

FIG. 25B shows a representative plot of amplitude versus time for the current $i_{L1} \sin \omega t$. The plot of FIG. 25A shows the charging current iCH which is the derivative of the line current of FIG. 25B. Furthermore, FIG. 25A shows that only the negative half cycles of the current depicted therein are integrated. Convenient amplitude references 220, 230 and 240 are provided for the line current of FIG. 25B to show the difference between a 1 per unit amplitude, a ½ per unit amplitude, and a 2 per unit amplitude respectively for the purpose of providing three illustrative Examples. Amplitudes 220A, 230A and 240A for the graph of FIG. 25A show correspondence with the per unit amplitude variations for the curve of FIG. 25B. Correspondingly, two curves or traces 230B, and 220B for Example 1 and Example 2, respectively, are shown. The 5-volt maximum input voltage line is shown at 246 in FIG. 25C. The algorithm of FIG. 22 is entered once each half cycle for 32 consecutive half cycles. Each half cycle within this interval of time is uniquely identified with a number stored as HCYCLE. Half cycles numbered 2, 4, 8, 16, and 32 identify intervals of integration each a factor of two longer than its predecessor. It is at the end of these specific intervals that the algorithm re-evaluates the voltage VC101.

Assume that the input signal is repeating each cycle during the course of the 32 intervals. Then the voltage VC101 at the end of any interval identified by HCYCLE=2, 4, 8, 16, or 32 will be twice the size it was at the end of the preceding interval. Thus if a previous interval yielded an A/D conversion in excess of 80 H, corresponding to a value of VC101 in excess of 2.5 V, it can be safely assumed that in the present interval, VC101 is in excess of 5 volts and that an A/D conversion now performed would yield an invalid result since the A/D converter is not capable of digitizing values in excess of 5 volts. Thus the algorithm, in the event that a previous result is in excess of 80 H, retains that result as the best possible A/D conversion with which to proceed.

On the other hand, if a previous A/D conversion is less than 80 H, it can safely be assumed that a meaningful A/D conversion can now be performed since the signal at the present time can be no greater than twice the previous value and still less than 5 volts. The advantage of replacing an earlier A/D conversion with one performed now is that the signal to be converted is twice as large and will yield more bits of resolution.

Once an A/D result in excess of 80 H has been realized, it must be adjusted to account for the interval in which the A/D conversion was performed. The left shift operation 188 performs this function. For instance, a result of 80 H acquired at the end of interval 4 is the result of an input signal twice as large as an input signal which yields a result of 80 H at the end of interval 8. The left shift of the interval 4 result correspondingly doubles this result by the end of interval eight. At the end of thirty-two half cycles a 12 bit answer contained in the accumulator 202 of FIG. 23 represents at least a very close approximation of the value of the electrical current in the line being measured. It is this value that is utilized by the microprocessor U2 in a manner described previously and hereinafter for controlling the contactor 10. At HCYCLE 33 the entire process is re-initialized for subsequent utilization on another transformer or transducer 62B and thereafter 62C. Of course, this is repeated periodically in a regular manner by the microprocessor U2.

Plot 220B of FIG. 25C shows that the voltage $V_{C101}$ increases as a function of the integration of the current iCH of FIG. 25A. For each positive half cycle of the charging current iCH, no integration occurs. However, for each negative half cycle an integration following the negative cosine curve occurs. These latter values are accumulated to form voltage $V_{C101}$. Voltage $V_{C101}$ thus increases in correspondence with the value of the line current being sampled over the time represented by the thirty-two half cycles until the capacitive element C101 is discharged to zero during the thirty-third half cycle.

Figure 26:
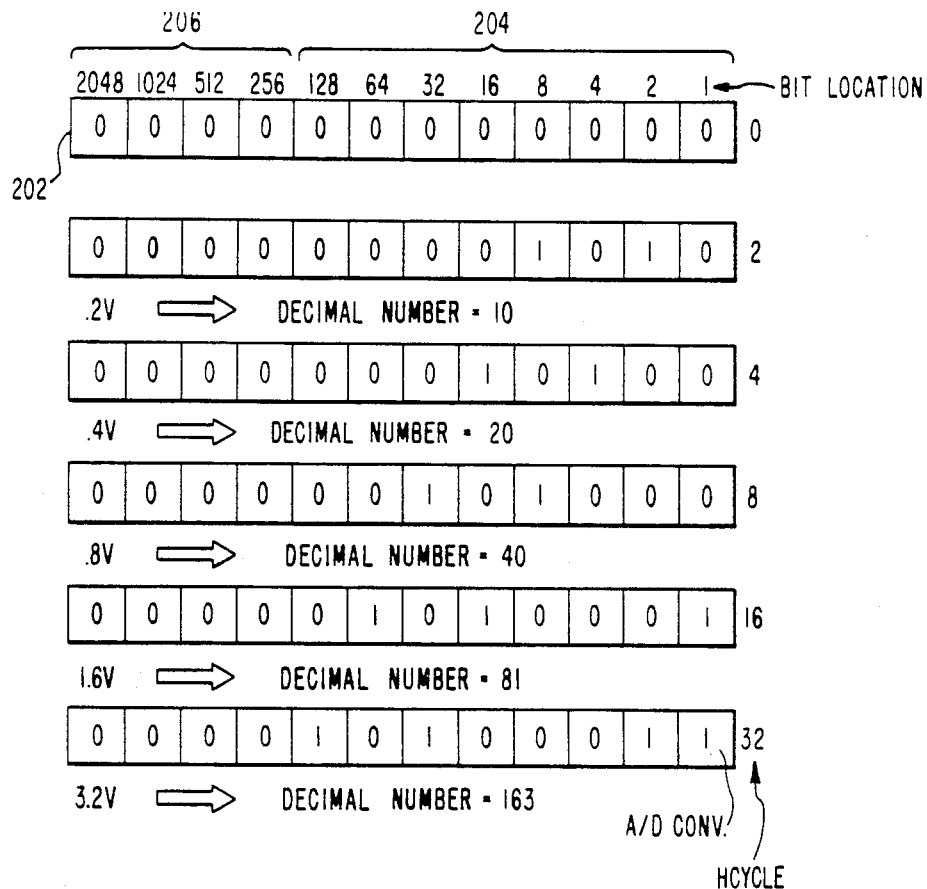
FIG. 26 shows a representation of the binary numbers stored in storage locations in the microprocessor of FIG. 23 for Example 1 of an analog-to-digital conversion for six sampling times in the RANGE sampling routine of FIG. 22 for the one-half per unit line cycle.

Referring now to FIGS. 22, 24, 25 and 26 the accumulator portrait for Example 1, is shown and described. In Example 1 the ½ per unit charging current iCH 230a is utilized to charge the capacitor C101 to produce the capacitor voltage VC101. The profile for this voltage is shown generally at 230b on FIG. 25C. This voltage is sampled by the "RANGE" algorithm according to function block 184 of FIG. 22. At the "2", "4", "8", "16" and "32" HCYCLE benchmarks the "RANGE" algorithm then determines as is set forth in function block 186 of FIG. 22 whether the previous analog-to-digital conversion result was equal to or greater than 80 hex. 80 hex equals a digital number of 128. If the answer to that question is no then the analog voltage VC101 present on the input AN1 of the analog-to-digital converter 200 is digitized and saved as is indicated in function block 192 of FIG. 22 and shown graphically in FIG. 26. HCYCLE is incremented by 1 and the routine is begun again. As long as the previous analog-to-digital conversion result is not greater than or equal to 80 hex there is no need to utilize the "left shifting" technique of the present invention. Consequently, Example 1 depicted in FIG. 26 shows a sampling routine which never is forced to utilize the left shifting technique. In particular in Example 1 of FIG. 26 at HCYCLE equal to 0.2 volts is available at the input of the analog-to-digital converter 200 on terminal AN1 this will be digitized providing a binary number equivalent to the decimal number 10. The binary number in question has a digital 1 in the "2" and "8" locations of the memory portion 204 and digital zeros in all the other bit locations. The "HCYCLE 4" digitizes the analog voltage 0.4 volts provides a decimal number of 20 which places a digital 1 in the "16" "4" bit locations of the portion 204 with digital zeros in all other portions. At "HCYCLE 8" 0.8 volts is digitized providing a binary number which is equivalent to the decimal number 40 and which is formed by placing digital ones in the "32" and "8" locations of the portion 204. At HCYCLE 16 1.6 volts is digitized providing a digital number which is represented by the decimal number 81. The digital number has digital ones in the "64" and "16" bit locations of the portion 204. Finally, at HCYCLE equal 32 3.2 volts is digitized generating a digital number equivalent to the decimal number 163. Where the digital number in question has digital 1 in the "128", "32", "2" and "1" bit locations of the accumulator 204. At this point the "RANGE" algorithm has been complete for Example 1. It will be noted as was described previously that the "RANGE" algorithm never entered into function block 188 where a left shifting would be required. However, as will be described hereinafter with respect to Example 2 and Example 3, the left shifting technique will be utilized.

Figure 27:
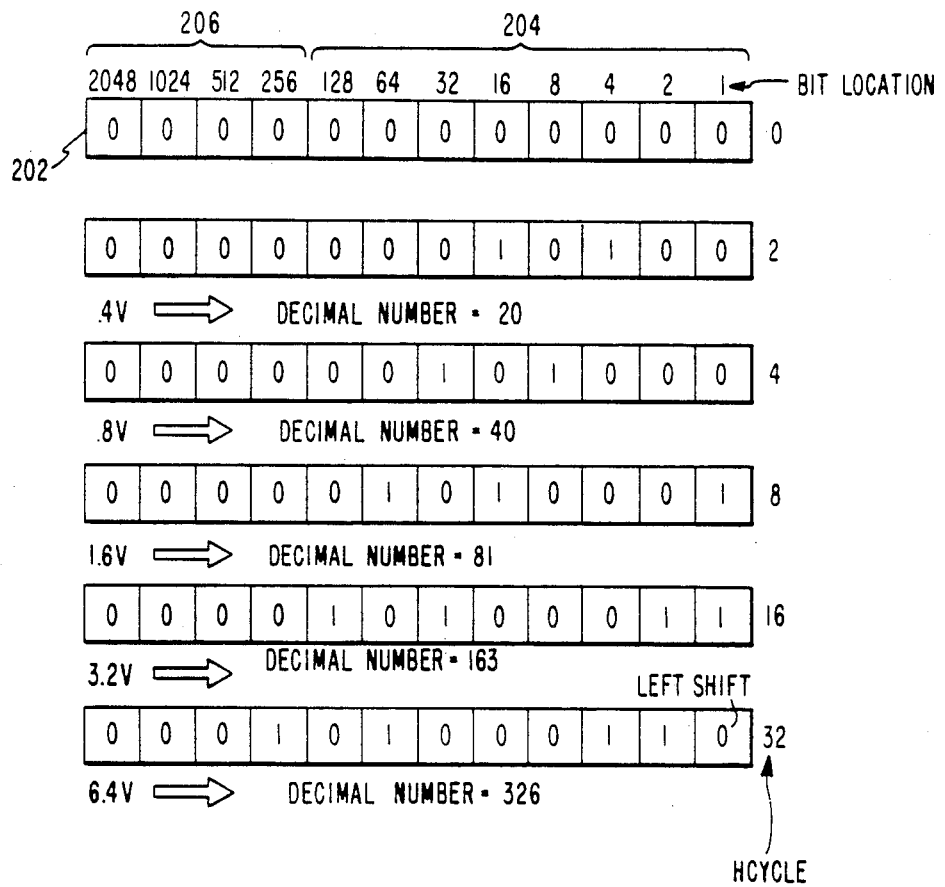
FIG. 27 shows a representation of the binary numbers stored in storage locations in the microprocessor of FIG. 23 for Example 2 of an analog-to-digital conversion for six sampling times in the RANGE sampling routine of FIG. 22 for the one per unit line cycle.
Figure 28:
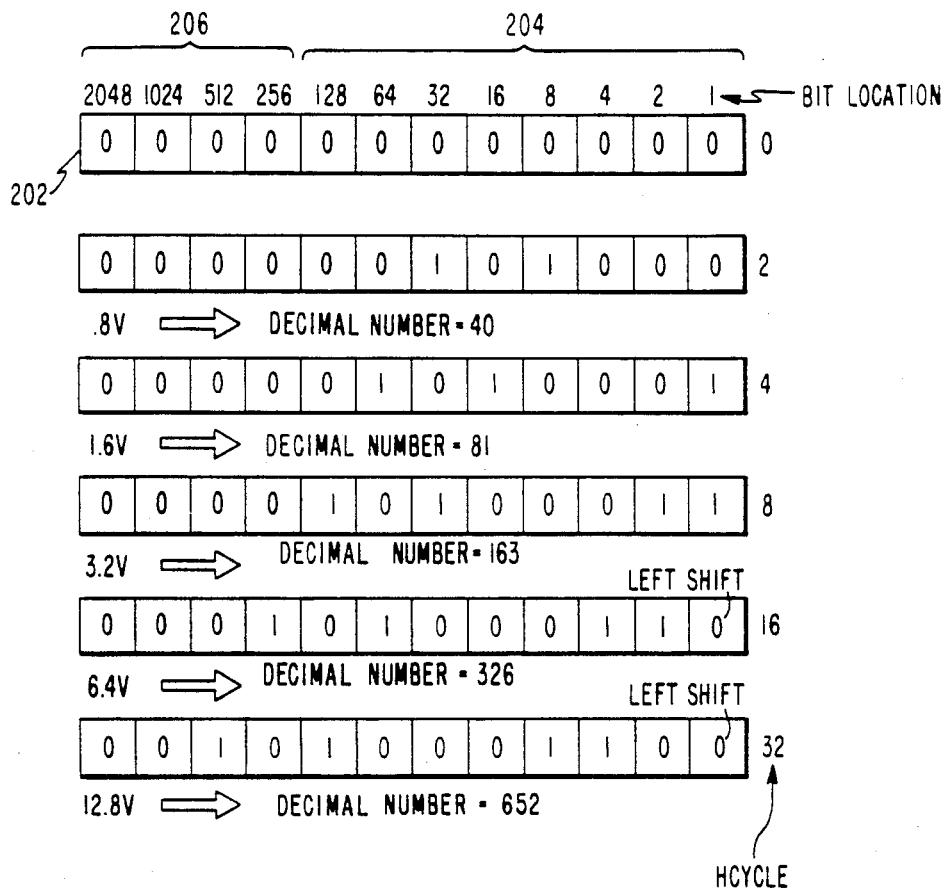
FIG. 28 shows a representation of the binary numbers stored in storage locations in the microprocessor of FIG. 23 for Example 3 of an analog-to-digital conversion for six sampling times in the RANGE sampling routine of FIG. 22 for the two per unit line cycle.

Referring now to FIGS. 22, 24, 25 and 27 an Example 2 is depicted in which a one per unit charging current iCH 220a is utilized to generate a voltage VC101 across the capacitive element C101. The voltage generated when plotted against HCYCLE is shown at 220b in FIG. 25C. Once again the "RANGE" algorithm of FIG. 22 is utilized. As was the case previously the "RANGE" algorithm is utilized in such a manner that the memory locations 202 are updated at the "2", "4", "8", "16" and "32" HCYCLE samples. At the "2" HCYCLE sample 0.4 volts is digitized providing a digital number in the portion 204 of the accumulator 202 which is equivalent to the decimal number 20. That digital number has a digital 1 in the "16" and "4" bit locations of the portion 204. There are digital zeros in all the other bit locations. At HCYCLE equal 4 0.8 volts is digitized providing a digital number equivalent to the decimal number 40. The digital number has a digital 1 in the "32" and "8" bit locations of the portion 204 of the accumulator 202. At HCYCLE equal 8 1.6 volts is digitized providing a digital number in the portion 204 of the accumulator 202 which is equivalent to the decimal number 81. The digital in question has digital or logic ones in bit locations "64", "16" and "1". At HCYCLE equal 16 3.2 volts is digitized providing a digital number for portion 204 of accumulator 202 which is equivalent to the decimal number 163. The latter digital number has digital ones in bit locations "128", "32", "2" and "1". At HCYCLE equal 32 the "RANGE" algorithm determines by utilizing functional block 186 that the previous A-to-D result produced a digital number which was larger than 80 hex. Consequently, for the first time in this series of examples, functional block 188 is utilized and a "left shift" is accomplished. Consequently, even though 6.4 volts is available at the input of the analog-to-digital converter 200 for digitization, the digitization does not take place for the simple reason that the output of the analog-to-digital converter would be unreliable with such a large analog number on its input. Instead, the digital number stored in the portion 204 of the accumulator 200 during the previous digitization of the 3.2 volt analog signal is merely shifted one place to the left for each bit in the digital number to provide a new digital number which is equivalent to the decimal number 326. The new digital number utilizes a portion of the spill-over member 206 of the accumulator 202 as is clearly shown in FIG. 27. The new digital number has digital ones in the "256", "64", "4" and "2" bit locations of the expanded accumulator 202. Notice how the digital number in the "32" HCYCLE location of FIG. 27 is the same digital number shown in HCYCLE location "16" but moved one bit location to the left. This example shows the left shifting technique in operation. The number stored in the accumulator 202 at the end of the 32nd HCYCLE is indicative of the line current $i_{L1}(t)$ that was measured in the overload relay portion 60' of the contactor 10.

Referring now to FIGS. 22, 24, 25 and 28 still a third example of the left shifting technique is described. In particular in Example 3 a two per unit charging current iCH indicated at 240a in FIG. 25B is integrated by the capacitor C101 to provide the voltage VC101. This voltage produces an output profile similar to that shown with respect to Examples 1 and 2 in FIG. 25C but following the slope generally depicted at Example 3 in FIG. 25C. The step-like relationship for the voltages is deleted from Example 3 in order to avoid confusion. However it is to be understood that the step-like voltages exist for Example 3 in much the same way as they exist for Example 1 and Example 2. With regard to Example 3 the "RANGE" algorithm samples at HCYCLE equal "2", "4" and "8" and provides appropriate analog-to-digital conversions to update the portion 204 of the accumulator 202. However, at HCYCLE samples "16" and "32" the portion 204 of the accumulator 202 is updated by two successive serial left shifts of the previous information stored in the location 204 rather than by an analog-to-digital conversion. It is clear that an analog-to-digital conversion would have produced an unreliable result for the latter two samples. To be specific at HCYCLE equal "2" 0.8 volts is digitized producing a digital number equivalent to the decimal number 40. The digital number has digital ones in the "32" and "8" bit locations of the portion 204 of the accumulator 202. At the "4" HCYCLE sample 1.6 volts is digitized producing a digital number equivalent to the decimal number 81. The latter digital number has digital ones in the "64", "16" and "1" bit locations of the portion 204 of the accumulator 202. At sample HCYCLE equals 8 3.2 volts is digitized providing a digital number equivalent to the decimal number 163. The digital number has digital ones in the "128", "32", "2" and "1" bit locations of the portion 204 of the accumulator 200. At HCYCLE equal 16 the "RANGE" algorithm recognizes that the previous A-to-D result (equivalent to the digital number 163) was greater than 80 hex and therefore the accumulator 202 is updated not by a way of an analog-to-digital conversion of voltage on the input of the analog-to-digital converter 200 but rather than by left shifting by one bit the digital information previously stored in the accumulator 202 as a result of completion of the HCYCLE equal "8" sample. Consequently, for the "16" HCYCLE sample a digital number equivalent to the decimal 326 is formed. This is done by left shifting the information that was previously stored in the accumulator by one bit to the left. This causes the aforementioned digital number to pour over into one bit location of the pour-over portion 206 of the accumulator 202. The new digital number has a digital 1 in the "256", "64", "4" and "2" bit locations of the accumulator 202. At the HCYCLE equal "3" sample the number stored previously in accumulator 202 is left shifted once again in the accumulator 202 to now occupy two of the locations in pour-over portion 206 as well as all eight locations in portion 204. The new digital number has a decimal equivalent of 652. The new digital number has a digital one in the "512" location, "128" location, the "8" bit location and the "4" bit location. This number is then utilized to represent the current measured in the line by way of the overload relay board 60, the value stored in the accumulator 202 will be utilized as described previously for performing useful functions by the contactor or controller 10.

Figure 29:
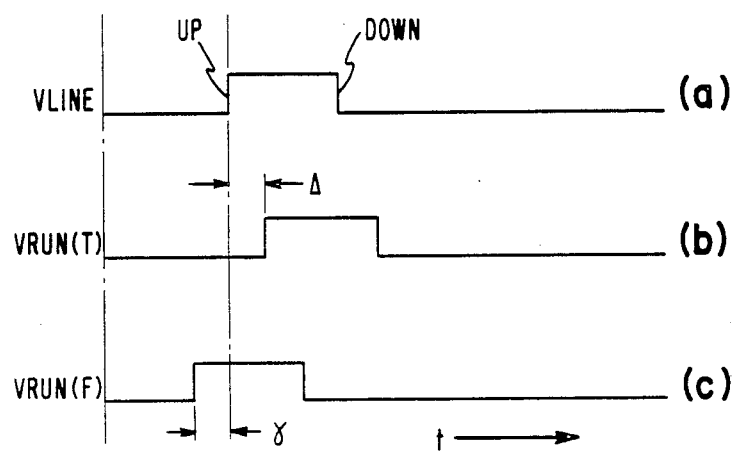
FIG. 29 shows plots of VLINE, VRUN(T), and VRUN(F) at the input of the microprocessor.

Referring once again to FIGS. 7A through 7D apparatus and technique associated with switch SW101 and the 8-bit static shift register U104 is described. The inputs designated H0 through H4 on switch SW101 represents switch arrangements for programming a digital number which can be read by the microprocessor U2 for making a decision and determination about the ultimate value of the full load current detected by the previously described system. These switch values as well as the switch values associated with "AM", "C0", and "C1" are serially read out by the microprocessor U2 as part of the signal on line SW in correspondence with input information provided by the A, B and C input signals. Input information SW is provided to input terminal I10 of the microprocessor U2. By utilizing the heater switch arrangement, 16 values of ultimate trip can be selected with four heater switches, H0 through H3, programmed in a binary fashion. The switches replace mechanical heaters which form part of the prior art for adjusting the overload range of the motor. There are also provided two inputs C0 and C1 which are utilized to input the motor class A class 10 motor will tolerate a locked rotor condition for 10 seconds and not be damaged, a class 20 motor, for 20 seconds, and a class 30 motor for 30 seconds. Locked rotor current is assumed to be six times normal current Referring once again to FIGS. 7A and 7B, FIG. 11 and FIG. 29, apparatus and method for discriminating between a true input signal and a false input signal on the "RUN", "START", and "RESET" inputs is depicted. In FIG. 11, a parasitic distributed capacitance CLL is shown between inputs lines connected to the "E" and "P" terminals of the terminal block J1 of the board 28. This capacitance may be due to the presence of extremely long input lines between the pushbuttons "STOP", "START" and "RESET" and the terminal block J1. Similar capacitance may exist between the other lines shown illustratively in FIG. 11. Parasitic capacitance has the undesirable feature of coupling signals among the input lines The affect of this is to introduce a false signal which appears to the microprocessor U2 to be a true signal indicative of the fact that the pushbutton "STOP", "START" and "RESET" are closed when in fact they may be open. Therefore, the purpose of the following apparatus is to distinguish between a true signal and a false signal on the latter mentioned input lines. It is necessary to understand that the capacitive current iCLL flowing through the distributed parasitic capacitance CLL leads the voltage which appears across it, that is, the voltage between terminals "E" and "P". Referring to FIG. 29A, VLINE as seen by the microprocessor U2 in its truncated form is shown. FIG. 29C shows the voltage that the microprocessor U2 sees, for example, on terminal B41 thereof as the result of the phantom current iCLL flowing through resistive element R3, the capacitive element C4 and the internal impedance on the RUN input terminal of the circuit U1. This voltage identified as VRUN(F)—for a false indication of voltage—leads the voltage VLINE by a value $\gamma$. If the capacitive elements CX and C4 are different and more specifically if the capacitive element CX is larger than the capacitive element C4, a true VRUN signal VRUN(T), that is a signal produced by closing the STOP switch as shown in FIG. 11, will be nearly in phase with voltage VLINE. The only difference being due to the difference in capacitance of the capacitive elements CX and C4. If capacitive element CX is smaller than capacitive element C4, the difference will cause the true voltage VRUN(T) to lag VLINE by an amount $\Delta$ as shown in FIG. 29B. The microprocessor U2 therefore is asked to compare voltage VLINE with the voltage on input terminal B41 within a short period of time—equal to or smaller than $\Delta$—after voltage VLINE has changed state or passed through an alternation indicated at "UP" and "DOWN" in FIG. 29A. If the digital value of the voltage on terminal B41 is the opposite digital signal from that associate with the voltage VLINE at this time, then the signal is a true signal as shown in FIG. 29B. If on the other hand it is of the same polarity, it is a false signal as shown in FIG. 29C. That is to say, for example, if voltage VLINE is measured within time period $\Delta$ after an "UP" and compared with the voltage on terminal B41, and the voltage on terminal B41 is a digital zero, the voltage signal on terminal B41 is a true signal. However, if the voltage signal is a digital 1 it is indicative that the voltage signal on terminal B41 is a false signal. By choosing the appropriate values for capacitive element CX and capacitive element C4, the amount by which a true signal will lead the line voltage, i.e., the delay $\Delta$ can be varied. The value of $\Delta$ is less than the value $\gamma$ so that the sign of a false signal cannot also be different from the sign of the reference voltage during the sampling or comparison interval.

Figure 10:
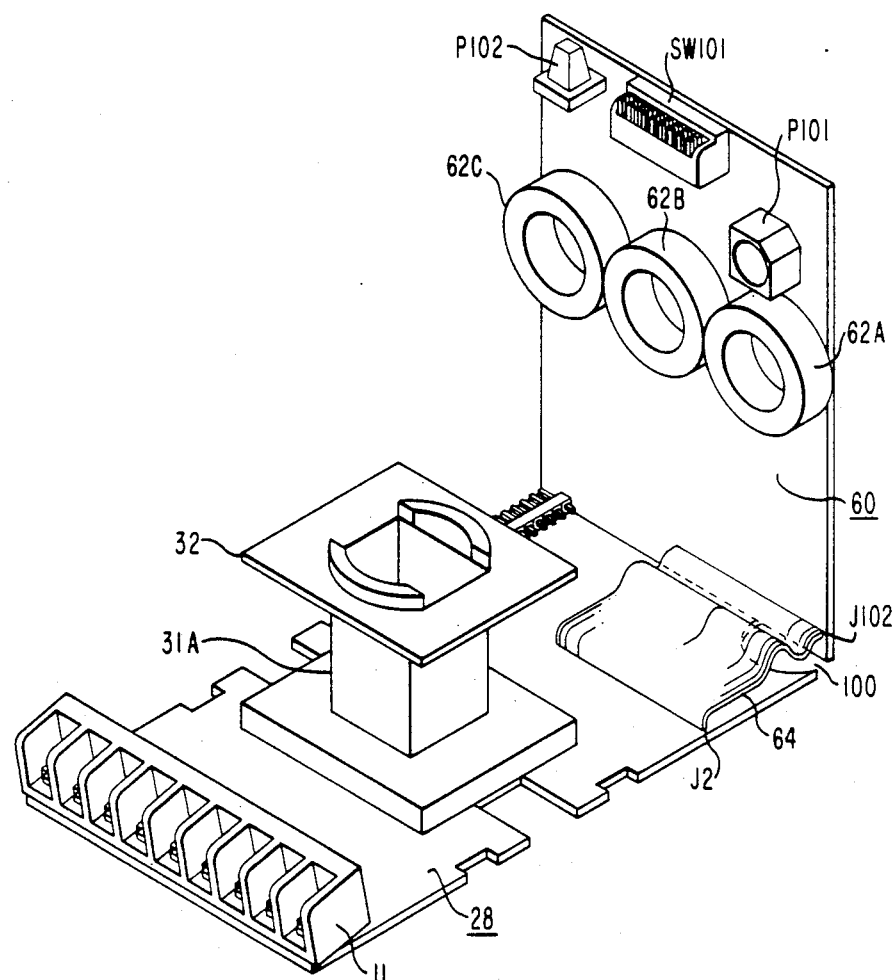
FIG. 10 shows the circuit board of FIGS. 8 and 9 in isometric view in a disposition for mounting in the contactor of FIG. 2.
Figure 11:
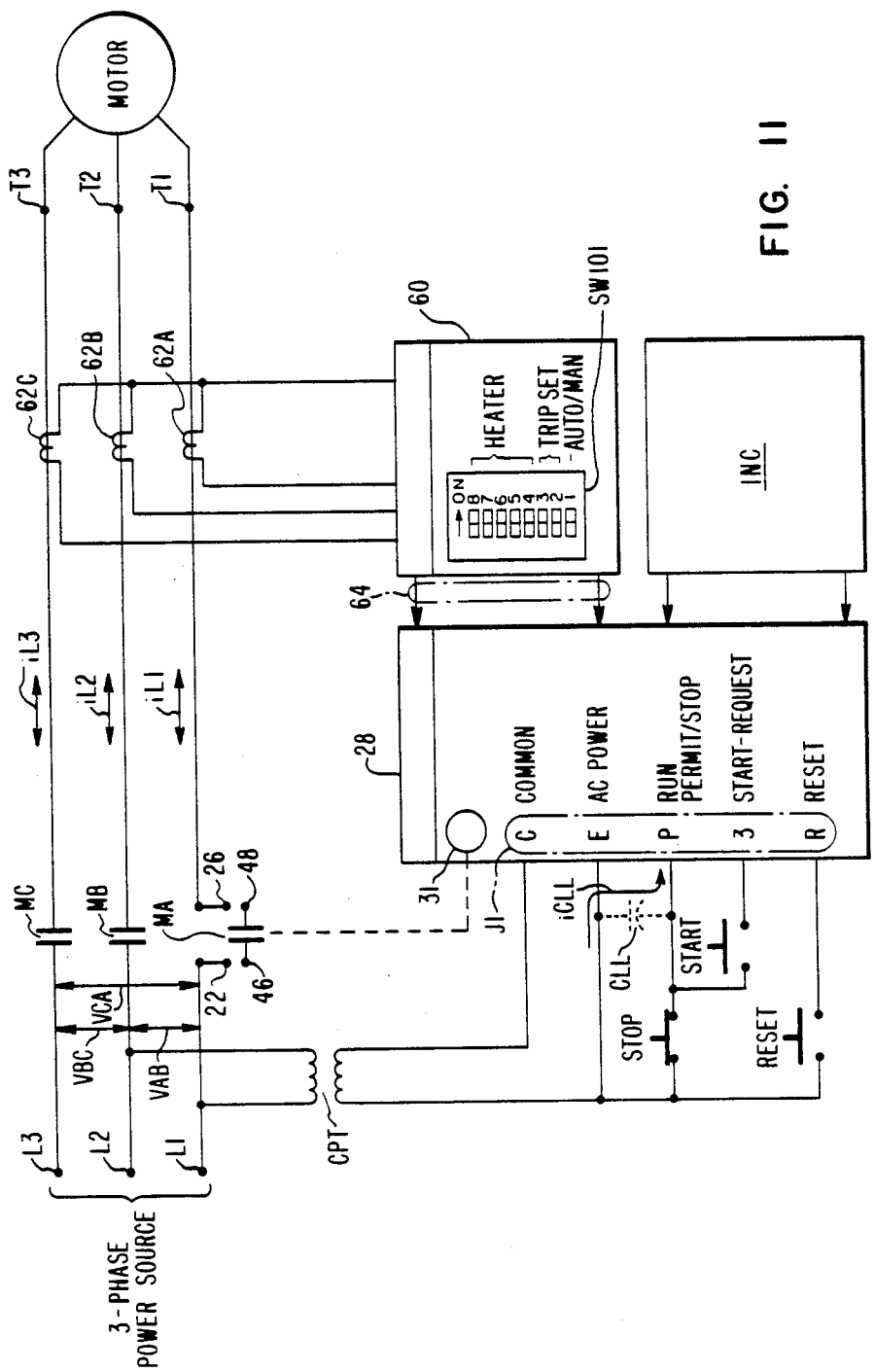
FIG. 11 shows a circuit diagram and wiring schematic partially in block diagram form for the contactor of FIGS. 2 and 7 as utilized in conjunction with a motor controlled thereby.
Figure 30:
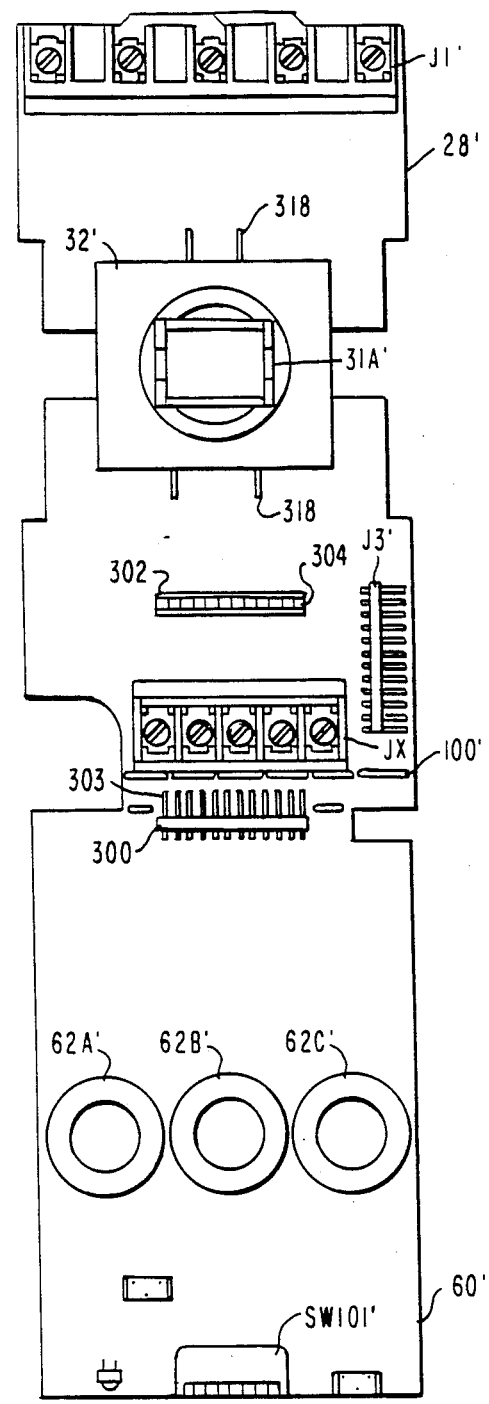
FIG. 30 shows a plan view of a printed circuit board similar to that shown in FIGS. 8 and 9 for utilization in another embodiment of the invention.

Referring now to FIG. 30, a printed circuit card shown to that in FIGS. 8, 9 and 10 is depicted for another embodiment of the invention. In the embodiment of FIG. 30 elements which are similar to elements of the apparatus shown in FIGS. 8, 9 and 10 are depicted with the same reference symbols primed ('). For simplicity of illustration and description reference may be had to FIGS. 8, 9 and 10 for identifying the similar elements and their interrelationship. It will be noted with respect to the apparatus of FIGS. 8, 9 and 10 that a ribbon connector 64 is utilized to interconnect solder connectors J2 with J101 and J102. However, in the embodiment of the invention shown in FIG. 30 the ribbon connector 64 is eliminated. Rather there is provided an electrically insulated base 300 in which are disposed male plug connectors 303. These are shown on the overload relay board 60'. On printed circuit board 28' is provided the female connector 302 for the male connector 300 of circuit board 60'. Female connector 302 has recesses or openings 304 therein which match or are complementary with the male plugs 303 of connector 300. Bobbin 32' is interconnected with board 28' by way of pens 318 which are soldered into appropriate openings in board 28' for assisting in supporting the board 28' as will be described hereinafter with respect to FIGS. 31 and 32. As was the case with respect to the embodiment shown in FIGS. 8, 9 and 10 the entire circuit board is broken after assembly at 100' and installed so that the connector 300 mates with the connector 302 in a manner shown and described with respect to FIGS. 31 and 32. In addition, a separate terminal block JX is provided for interconnection with a separate internal communication network (IUCOM) for communication between separate contactors and remote control and communication elements.

Figure 31:
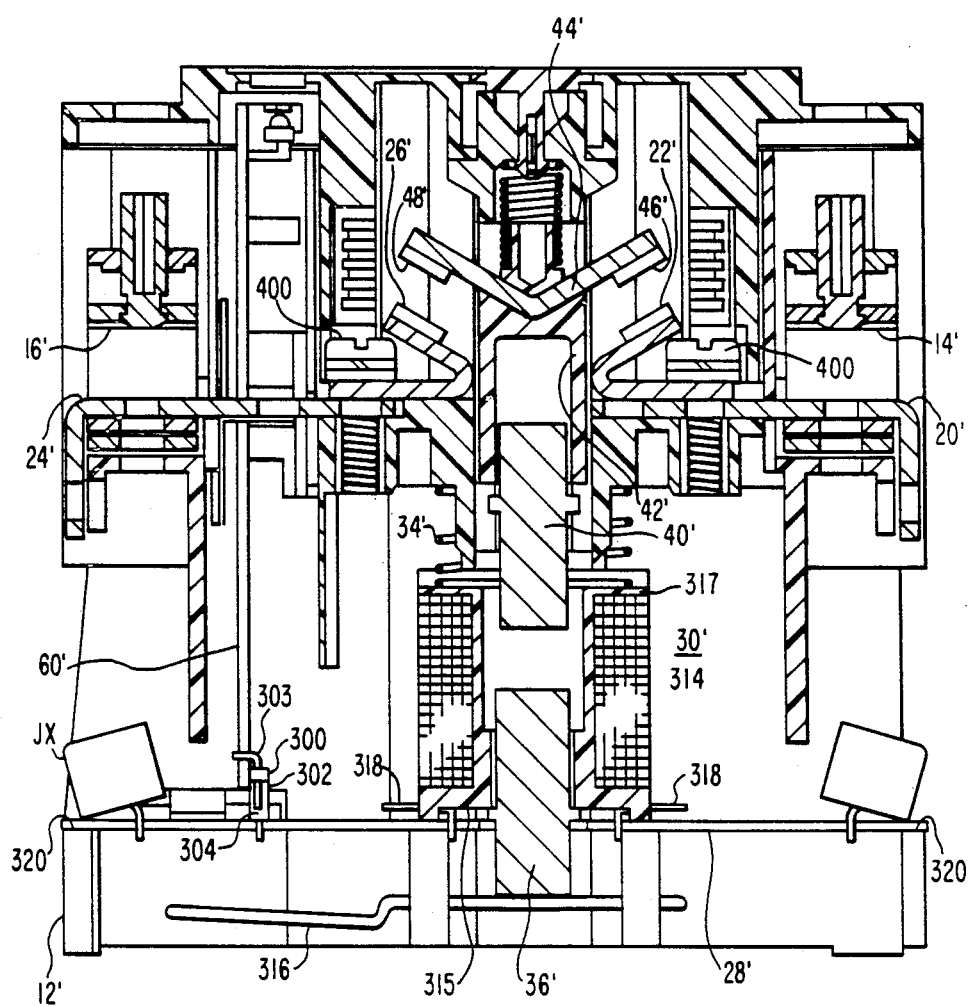
FIG. 31 shows a cutaway elevation of a contactor similar to that shown in FIGS. 1 and 2 for another embodiment of the invention.
Figure 32:
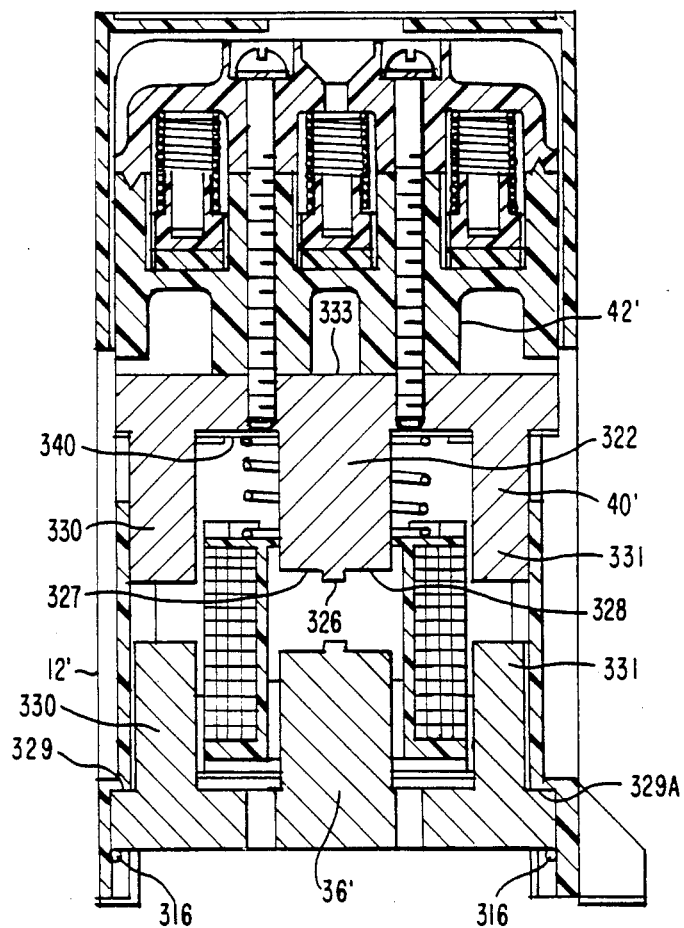
FIG. 32 shows a sectional view of the contactor of FIG. 31 along the section lines XXXII—XXXII.

Referring now to FIGS. 31 and 32 an embodiment of the invention similar to that shown in FIGS. 1 and 2 is depicted. In this embodiment of the invention elements which are identical to or similar to corresponding elements in the apparatus of FIGS. 1 and 2 are depicted with the same reference characters primed ('). For purposes of simplicity and clarity of illustration and description reference may be had to the description associated with the apparatus of FIGS. 1 and 2 for the understanding of the cooperation, function and operating of similar or identical elements in FIGS. 31 and 32. The circuit boards 60' and 28' are shown in their final assembled condition with the plug 300 interconnected with the female receptacle 302 in a manner described previously. In such an arrangement male electrically conducting members 303 are inserted into and make electrical contact with similar female members 304 for interconnecting elements on circuit board 60' with elements on circuit board 28'. It is also to be understood that circuit board 60' depicted in FIGS. 31 and 32, for example, is interconnected with circuit board 28' in a manner which leaves an offset portion upon which the extra terminal block JX is disposed. The embodiment of the invention depicted in FIGS. 31 and 32 shows a contactor comprising a one-piece thermoplastic insulating base 12' that holds terminal straps 20' and 24', terminal lugs 14' and 16', respectively, and stationary contacts 22' and 26', respectively. Appropriate screws 400 hold the stationary contacts and the terminal straps to the base. The base 12' also provides a positioning and a guidance system for moving contacts 46', 48', cross bar 44', spacer or carrier 42' and the armature 40' which will be described in greater detail hereinafter. The overload relay board 60' and the coil control board 28' are supported within the base 12' in a unique manner. More specifically, (as is best seen in FIG. 32) permanent magnet or slug 36' which may be identical to armature 40' or very similar thereto has a lip thereon 329 which is forcefully held against a corresponding lip 330 in the base 12' by the action of a retaining spring or retainer 316 This firmly marries the slug or permanent magnet 36' to the base 12'. In turn, the slug or permanent magnet 36' has a second lip 314 thereupon (best shown in FIG. 31) which engages and is forcefully held against a corresponding lip 315 in the bobbin 317 of the coil assembly 30'. The retaining pins 318 are disposed in the bobbin 317 and in turn are soldered to or otherwise securely disposed upon the coil control board 28' so that the coil control board 28' which may comprise flexible, electrically insulating material is securely supported in the central region thereof The corners of the circuit control board 28' are supported directly upon the base 12' at 320, for example. The overload relay board 60' is supported perpendicularly upon the coil control board 28' by the interaction of the pins and connectors 300, 302, 303 and 304. Coil assembly 30' is supported at the other end thereof by kickout spring 34' so that bobbin 317 is securely held in place between the aforementioned ridge or lip 314 on the magnet 36' and the base 12' by way of the compressive force of the spring 34'. As is best seen by reference to FIG. 32, the top portion of the spring 34' is trapped against a lip 340 on the bottom portion of the carrier or spacer 42' and moves therewith during the movement of the movable system which includes the moving contacts 46' and 48', the spacer 42' and the armature 40'.

Referring specifically to FIG. 32, the construction features and interaction of the generally E-shaped magnetic members 36' and 40' are shown. Movable armature 40' comprises a center leg 322 and two outboard legs 330 and 331. Legs 330 and 331 may be of slightly different cross-sectional area relative to each other in order to provide a keying function for the magnet 40'. The reason for this lies in the fact that after repeated use the face surfaces of the magnetic outboard legs 330 and 331 develop a wear pattern due to repeated striking of the complementary face surfaces of the magnetic slug or permanent magnet 36'. Consequently, when the magnetic members 40' and 36' are periodically removed for maintenance or other purposes, it is desirous to replace them in exactly the same orientation so that the previously begun wear pattern is maintained. If the two members 40' and 36' become reversed relative to each other a new wear pattern will emerge which is undesirable. The sum of the cross-sectional area of the legs 330 and 331 is generally equal to the cross-sectional area of the leg 332 for efficient magnetic flux conduction. In a preferred embodiment of the invention, a significant portion of the face of the middle leg 332 is milled away or otherwise removed therefrom in order to create a protrusion or nipple 326 and two significant air-gap regions 327 and 328. When the armature 40' is abutted against the slug or permanent magnet 36' the complementary outboard legs 331 and 330 are abutted in a face-to-face manner and the face portions of the nipples or protrusions 326 for the middle leg 322 are abutted in a face-to-face manner leaving significant air gaps in the regions 327 and 328 for both magnets. The presence of the air gaps has the affect of reducing the residual magnetism in the magnetic circuit formed by the abutted armature 40' and permanent magnet 36'. This is desirous in order to allow the kickout spring 34' to be effective for separating the magnetic members and opening the aforementioned contacts during a contact opening operation. Were the latter situation not the case contact separation may be defeated by the force of the residual magnetism. It is known that in a magnetic arrangement exposed to an alternating or periodic HOLD pulse. Magnetic noise may be introduced. Were the nipple portions 326 not present the HOLD pulses would cause the center leg 322 of the moving armature 40' to vibrate much in the way that the magnetic core of a radio speaker vibrates in the presence of its driving signal. Furthermore, the affect of the periodic HOLD pulse is to cause the back spine portion 333 of the armature 40' to deflect toward the middle thus causing the legs 330 and 331 of the movable armature 40' to correspondingly move to wipe against or rub against the face surfaces of the complementary legs 330 and 331 of the permanent magnet 36'. This has the effect of increasing surface wear which is undesirable. In order to eliminate the deflection and wear yet maintain the air gap the nipple or protrusion 336 is provided. This prevents movement of the leg 322 under the influence of the hold pulses but nevertheless reduces the residual magnetism to a point where the operation of the kickout spring 34' is effective.

Figure 33:
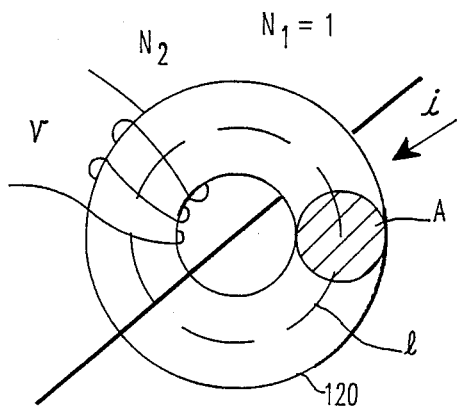
FIG. 33 shows a perspective schematic representation partially in section of a compressed powdered iron current-to-voltage transducer having a magnetic core as shown in FIG. 18.
Figure 34:
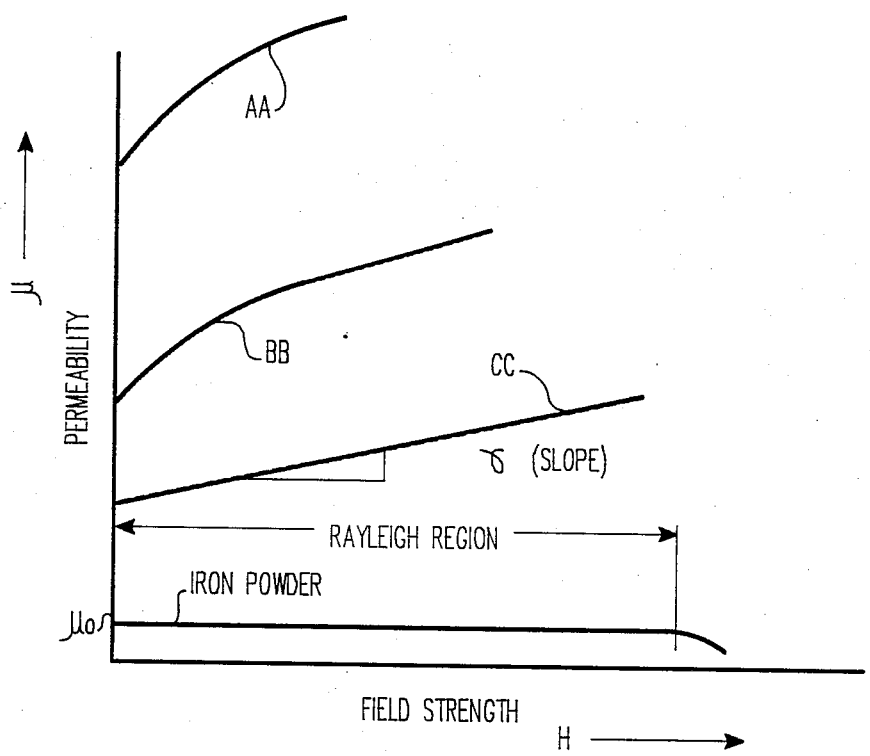
FIG. 34 shows a plot of field strength versus permeability for various kinds of magnetic materials.

Referring now to FIGS. 33 and 34, further explanation regarding the operation of transducer 62S of FIG. 18 is set forth. This description is especially useful for understanding how the transducer 62S may be utilized in electrical apparatus such as and electrical contactor, an electrical meter or an electrical relaying system for example to provide a voltage output v across the secondary winding thereof which is proportional to the derivative with respect to time of the current i in the primary winding thereof. This may be utilized for measurement or detection of current in a large range of current i where the error in the output voltage v relative to the current i in the large range is extremely small. For example, for a current range which varies between 0.1 amps and 2000 amps the output voltage v is a relatively faithful representation of the magnitude of the derivative of the current i with an error which is no greater than 1%. If iron powder is used for the core 120, in FIG. 34 (representative of FIG. 11—11 in the publication entitled, "Ferromagnetism" by R. M. Bozorth, as shown on page 489) it can be seen that the permeability $\mu$ as a function of the field strength H is relatively constant at a value $\mu_o$ over a relatively wide range of field strengths in a region known as the Rayleigh region or range. The Rayleigh constant which is equal to the slope ($\lambda$) of the magnetization curve is approximately equal to zero over the Rayleigh range for iron powder. Non-limiting examples of possible slopes for other ferromagnetic materials are shown at AA, BB and CC where the slope $\lambda$ is not equal to zero. Equation (9) shows the relationship of permeability $\mu$ as a function of the initial permeability $\mu o$, the Rayleigh constant $\lambda$ and the field strength H in the Rayleigh range for any material.

$$\mu = \mu o + \lambda H \quad (9)$$

$$H = \frac{iN1}{1} \quad (10)$$

Equation (10) shows the relationship of field strength H versus current i.

$$\frac{\phi}{A} = \beta = \mu H = \frac{\mu N 1 i}{1} \quad (11)$$

Equation (11) shows the relationship of flux ($\phi$), the flux density ($\beta$) and field strength (H).

$$v = N2 \frac{d\phi}{dt} \quad (12)$$

Equation (12) shows the relationship of the output voltage on the secondary winding of the current-to-voltage transducer 62S as a function of flux and the number of turns N2 in the secondary winding.

$$v = \frac{N1 N2 A}{1} \frac{d\mu i}{dt} \quad (13)$$

Equation (13) shows equation (12) with the constant values clustered.

$$v = \frac{N1 N2 A}{1} \frac{d(\mu o + \lambda H)i}{dt} \quad (14)$$

Equation (14) shows equation (13) with equation (9) substituted.

$$v = \frac{N1 N2 A}{1} \mu o \frac{di}{dt} : \text{if } \lambda = 0 \quad (15)$$

Equation (15) shows equation (14) for the special case when $\mu o$ is constant.

$$v = \frac{k di}{dt} : \text{if } \lambda = 0 \quad (16)$$

Equation (16) depicts equation (15) in a more simplified form. As a result, if an iron powder toroidal core such as carbonyl E is used as the core 120 of the transducer 62S, the voltage v is proportional to the first derivative of the current i with respect to time. The Rayleigh region lies well within the excitation or nonsaturation region for a core such as 120.

I claim:

1. Motor control apparatus of the kind which performs a motor control operation as a function of motor current, comprising:
   a current-to-voltage transducer, comprising:
   homogeneous magnetic core means;
   primary winding means disposed to electromagnetically interact with said homogeneous magnetic core means for providing magnetic flux in said homogeneous magnetic core means in general proportion to the amount of electrical current I flowing in said primary winding means for values of said electrical current I within a given range of current I;
   homogeneous magnetic core means comprising powdered metal and interposed microscopic air gaps characterized by a Rayleigh Constant $\lambda$ of such magnitude that a value $\lambda H$ is significantly less than the initial permeability $\mu o$ of the homogeneous magnetic core means, thus causing the relationship:

$$\frac{d(\mu o + \lambda H)I}{dt} \simeq \mu o \frac{dI}{dt}$$

for said entire range of Current I, where H Equals the electromagnetic field strength attributable to said magnetic flux;
   secondary winding means disposed on said homogeneous magnetic core means for providing an electrical voltage V at the output terminals thereof which is generally approximately proportional to the first derivative of said current I with respect to time for said entire range of current I; and
   voltage sensitive means disposed to receive said electrical voltage V and to provide said control operation in response thereto.

2. The combination as claimed in claim 1 wherein said primary winding means comprises a single turn.

3. The combination as claimed in claim 1 wherein said powdered metal comprises ferrite.

4. The combination as claimed in claim 1 wherein said powdered metal is sintered.

5. The combination as claimed in claim 1 wherein said electrical current I is said motor current.

6. The combination as claimed in claim 1, wherein said metal comprises iron.

7. The combination as claimed in claim 1, wherein the relationship of $\lambda H$ to $\mu o$ is such that the contribution to the change in voltage V related to the value:

$$\frac{d(\mu o + \lambda H)I}{dt}$$

varies over said range of current I by $\leq 1\%$ of the contribution to the change in voltage V related to the value:

$$\frac{d\lambda HI}{dt}.$$

8. A contactor of the kind which opens and closes an electrical circuit, comprising:
   a current-to-voltage transducer, comprising:
   homogeneous magnetic core means;
   primary winding means disposed to electromagnetically interact with said homogeneous magnetic core means for providing magnetic flux in said homogeneous magnetic core means in general proportion to the amount of electrical current I flowing in said primary winding means for values of said electrical current I within a given range of current I;

homogeneous magnetic core means comprising powdered metal and interposed microscopic air gaps characterized by a Rayleigh Constant λ of such magnitude that a value λH is significantly less than the initial permeability $\mu_o$ of the homogeneous magnetic core means, thus causing the relationship:

$$\frac{d(\mu_o + \lambda H)I}{dt} \simeq \mu_o \frac{dI}{dt}$$

for said entire range of Current I, where H Equals the electromagnetic field strength attributable to said magnetic flux;
secondary winding means disposed on said homogeneous magnetic core means for providing an electrical voltage V at the output terminals thereof which is generally approximately proportional to the first derivative of said current I with respect to time for said entire range of current I; and
voltage sensitive means disposed to receive said electrical voltage V and to open said electrical circuit when required in response thereto.

9. The combination as claimed in claim 8 wherein said primary winding means comprises a single turn.

10. The combination as claimed in claim 8 wherein said powdered metal comprises ferrite.

11. The combination as claimed in claim 8 wherein said powdered metal is sintered.

12. The combination as claimed in claim 8 wherein said electrical current I is current which flows in said electrical circuit.

13. The combination as claimed in claim 8, wherein said metal comprises iron.

14. The combination as claimed in claim 8, wherein the relationship of λH to $\mu_o$ is such that the contribution to the change in voltage V related to the value:

$$\frac{d(\mu_o + \lambda H)I}{dt}$$

varies over said range of current I by ≦1% of the contribution to the change in voltage V related to the value:

$$\frac{d\lambda HI}{dt}.$$

15. A current-to-voltage transducer, comprising:
homogeneous magnetic core means;
primary winding means disposed to electromagnetically interact with said homogeneous magnetic core means for providing magnetic flux in said homogeneous magnetic core means in general proportion to the amount of electrical current I flowing in said primary winding means for values of said electrical current I within a given range of current I;
said homogeneous magnetic core means comprising generally homogeneously dispersed magnetic regions and non-magnetic regions therein characterized by a Rayleigh Constant λ of such magnitude that a value λH is significantly less than the initial permeability $\mu_o$ of the homogeneous magnetic core means, thus causing the relationship:

$$\frac{d(\mu_o + \lambda H)I}{dt} \simeq \mu_o \frac{dI}{dt}$$

for said entire range of Current I, where H Equals the electromagnetic field strength attributable to said magnetic flux; and
secondary winding means disposed on said homogeneous magnetic core means for providing an electrical voltage V at the output terminals thereof which is generally approximately proportional to the first derivative of said current I with respect to time for said entire range of current I.

16. The combination as claimed in claim 15 wherein said magnetic core means comprises powdered metal particles separated by regions of low magnetic permeability.

17. The combination as claimed in claim 16 wherein said regions of low magnetic permeability comprise air gaps.

18. The combination as claimed in claim 15 wherein said magnetic core means is toroidal.

19. The combination as claimed in claim 15 wherein said total magnetic permeability is generally constant for values of said electrical current I less than or equal to said predetermined amount.

20. The combination as claimed in claim 15 wherein said voltage V is generally directly proportional to said current I when I is sinusoidal.

21. The combination as claimed in claim 15 wherein said magnetic regions and said non-magnetic regions are microscopic.

22. The combination as claimed in claim 15, wherein said magnetic regions comprise powdered iron.

23. The combination as claimed in claim 15, wherein the relationship of λH to $\mu_o$ is such that the contribution to the change in voltage V related to the value:

$$\frac{d(\mu_o + \lambda H)I}{dt}$$

varies over said range of current I by ≦1% of the contribution to the change in voltage V related to the value:

$$\frac{d\lambda HI}{dt}.$$

24. Motor control apparatus of the kind which performs a motor control operation as a function of motor current, comprising:
a current-to-voltage transducer, comprising:
homogeneous magnetic core means;
primary winding means disposed to electromagnetically interact with said homogeneous magnetic core means for providing magnetic flux in said homogeneous magnetic core means in general proportion to the amount of electrical current I flowing in said primary winding means for values of said electrical current I within a given range of current I;
said homogeneous magnetic core means comprising generally homogeneously dispersed magnetic regions and non-magnetic regions therein characterized by a Rayleigh Constant λ of such magnitude that a value λH is significantly less than the initial permeability $\mu o$ of the homogeneous magnetic core means, thus causing the relationship:

$$\frac{d(\mu o + \lambda H)I}{dt} \simeq \mu o \frac{dI}{dt}$$

for said entire range of Current I, where H Equals the electromagnetic field strength attributable to said magnetic flux;
secondary winding means disposed on said homogeneous magnetic core means for providing an electrical voltage V at the output terminals thereof which is generally approximately proportional to the first derivative of said current I with respect to time for said entire range of current I; and
voltage sensitive means disposed to receive said electrical voltage V and to provide said control operation in response thereto.

25. The combination as claimed in claim 24 wherein said magnetic core means comprises powdered metal particles separated by regions of low magnetic permeability.

26. The combination as claimed in claim 25 wherein said regions of low magnetic permeability comprise air gaps.

27. The combination as claimed in claim 24 wherein said magnetic core means is toroidal.

28. The combination as claimed in claim 24 wherein said total magnetic permeability is generally constant for values of said electrical current I less than or equal to said predetermined amount.

29. The combination as claimed in claim 24 wherein said voltage V is generally directly proportional to said current I when I is sinusoidal.

30. The combination as claimed in claim 24 wherein said magnetic regions and said non-magnetic regions are microscopic.

31. The combination as claimed in claim 24 wherein said electrical current I is said motor current.

32. The combination as claimed in claim 24, wherein said magnetic regions comprise powdered iron.

33. The combination as claimed in claim 24, wherein the relationship of $\lambda H$ to $\mu o$ is such that the contribution to the change in voltage V related to the value:

$$\frac{d(\mu o + \lambda H)I}{dt}$$

varies over said range of current I by $\leq 1\%$ of the contribution to the change in voltage V related to the value:

$$\frac{d\lambda HI}{dt}.$$

34. A contactor of the kind which opens and closes an electrical circuit, comprising:
a current-to-voltage transducer, comprising:
homogeneous magnetic core means;
primary winding means disposed to electromagnetically interact with said homogeneous magnetic core means for providing magnetic flux in said homogeneous magnetic core means in general proportion to the amount of electrical current I flowing in said primary winding means for values of said electrical current I within a given range of current I;
said homogeneous magnetic core means comprising generally homogeneously dispersed magnetic regions and non-magnetic regions therein characterized by a Rayleigh Constant $\lambda$ of such magnitude that a value $\lambda H$ is significantly less than the initial permeability $\mu o$ of the homogeneous magnetic core means, thus causing the relationship:

$$\frac{d(\mu o + \lambda H)I}{dt} \simeq \mu o \frac{dI}{dt}$$

for said entire range of Current I, where H Equals the electromagnetic field strength attributable to said magnetic flux;
secondary winding means disposed on said homogeneous magnetic core means for providing an electrical voltage V at the output terminals thereof which is generally approximately proportional to the first derivative of said current I with respect to time for said entire range of current I; and
voltage sensitive means disposed to receive said electrical voltage V and to open said electrical circuit when required in response thereto.

35. The combination as claimed in claim 34 wherein said magnetic core means comprises powdered metal particles separated by regions of low magnetic permeability.

36. The combination as claimed in claim 35 wherein said regions of low magnetic permeability comprise air gaps.

37. The combination as claimed in claim 34 wherein said magnetic core means is toroidal.

38. The combination as claimed in claim 34 wherein said total magnetic permeability is generally constant for values of said electrical current I less than or equal to said predetermined amount.

39. The combination as claimed in claim 34 wherein said voltage V is generally directly proportional to said current I when I is sinusoidal.

40. The combination as claimed in claim 34 wherein said magnetic regions and said non-magnetic regions are microscopic.

41. The combination as claimed in claim 34 wherein said electrical current I is said motor current which flows in said electrical circuit.

42. The combination as claimed in claim 34, wherein the relationship of $\lambda H$ is $\mu o$ is such that the contribution to the change in voltage V related to the value:

$$\frac{d(\mu o + \lambda H)I}{dt}$$

varies over said range of current I by $\leq 1\%$ of the contribution to the change in voltage V related to the value:

$$\frac{d\lambda HI}{dt}.$$

43. Motor control apparatus of the kind which performs a function in response to the flow of electrical current I, comprising:
a current-to-voltage transducer, comprising:
homogeneous magnetic core means;
primary winding means disposed to electromagnetically interact with said homogeneous magnetic core means for providing magnetic flux in said homogeneous magnetic core means in general proportion to the amount of said electrical current I flowing in said primary winding means for values of said electrical current I within a given range of current I;

said homogeneous magnetic core means comprising generally homogeneously dispersed magnetic regions and non-magnetic regions therein characterized by a Rayleigh Constant λ of such magnitude that a value λH is significantly less than the initial permeability μo of the homogeneous magnetic core means, thus causing the relationship:

$$\frac{d(\mu o + \lambda H)I}{dt} \simeq \mu o \frac{dI}{dt}$$

for said entire range of Current I, where H Equals the electromagnetic field strength attributable to said magnetic flux;

secondary winding means disposed on said homogeneous magnetic core means for providing an electrical voltage V at the output terminals thereof which is generally approximately proportional to the first derivative of said current I with respect to time for said entire range of current I; and voltage sensitive means disposed to receive said electrical voltage V and to provide said function in response thereto.

44. The combination as claimed in claim 43 wherein said magnetic core means comprises powdered metal particles separated by regions of low magnetic permeability.

45. The combination as claimed in claim 44 wherein said regions of low magnetic permeability comprise air gaps.

46. The combination as claimed in claim 43 wherein said magnetic core means is toroidal.

47. The combination as claimed in claim 43 wherein said total magnetic permeability is generally constant for values of said electrical current I less than or equal to said predetermined amount.

48. The combination as claimed in claim 43 wherein said voltage V is generally directly proportional to said current I when I is sinusoidal.

49. The combination as claimed in claim 43 wherein said magnetic regions and said non-magnetic regions are microscopic.

50. The combination as claimed in claim 43, wherein the relationship of λH to μo is such that the contribution to the change in voltage V related to the value:

$$\frac{d(\mu o + \lambda H)I}{dt}$$

varies over said range of current I by ≦1% of the contribution to the change in voltage V related to the value:

$$\frac{d\lambda HI}{dt}.$$

51. An electrical meter of the kind which performs a meter function in response to the flow of electrical current I, comprising:
a current-to-voltage transducer, comprising:

homogeneous magnetic core means;

primary winding means disposed to electromagnetically interact with said homogeneous magnetic core means for providing magnetic flux in said homogeneous magnetic core means in general proportion to the amount of electrical current I flowing in said primary winding means for values of said electrical current I within a given range of current I;

said homogeneous magnetic core means comprising generally homogeneously dispersed magnetic regions and non-magnetic regions therein characterized by a Rayleigh Constant λ of such magnitude that a value λH is significantly less than the initial permeability μo of the homogeneous magnetic core means, thus causing the relationship:

$$\frac{d(\mu o + \lambda H)I}{dt} \simeq \mu o \frac{dI}{dt}$$

for said entire range of Current I, where H Equals the electromagnetic field strength attributable to said magnetic flux;

secondary winding means disposed on said homogeneous magnetic core means for providing an electrical voltage V at the output terminals thereof which is generally approximately proportional to the first derivative of said current I with respect to time for said entire range of current I; and voltage sensitive means disposed to receive said electrical voltage V and to provide said meter function in response thereto.

52. The combination as claimed in claim 51 wherein said magnetic core means comprises powdered metal particles separated by regions of low magnetic permeability.

53. The combination as claimed in claim 52 wherein said regions of low magnetic permeability comprise air gaps.

54. The combination as claimed in claim 51 wherein said magnetic core means is toroidal.

55. The combination as claimed in claim 51 wherein said total magnetic permeability is generally constant for values of said electrical current I less than or equal to said predetermined amount.

56. The combination as claimed in claim 51 wherein said voltage V is generally directly proportional to said current I when I is sinusoidal.

57. The combination as claimed in claim 51 wherein said magnetic regions and said non-magnetic regions are microscopic.

58. The combination as claimed in claim 51, wherein the relationship of λH is μo is such that the contribution to the change in voltage V related to the value:

$$\frac{d(\mu o + \lambda H)I}{dt}$$

varies over said range of current I by ≦1% of the contribution to the change in voltage V related to the value:

$$\frac{d\lambda HI}{dt}.$$

* * * * *